United States Patent
Ouyang et al.

(10) Patent No.: US 9,257,138 B1
(45) Date of Patent: Feb. 9, 2016

(54) SLIDER ASSEMBLY AND METHOD OF MANUFACTURING SAME

(71) Applicant: Western Digital (Fremont), LLC, Fremont, CA (US)

(72) Inventors: Bin Ouyang, Klong Luang (TH); Chee Kheng Lim, Pakkret (TH)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/526,207

(22) Filed: Oct. 28, 2014

(51) Int. Cl.
*G11B 5/48* (2006.01)
*G11B 5/00* (2006.01)

(52) U.S. Cl.
CPC ...... *G11B 5/4826* (2013.01); *G11B 2005/0021* (2013.01)

(58) Field of Classification Search
CPC .... G11B 5/486; G11B 5/4826; G11B 5/4853; G11B 11/1058; G11B 5/482
USPC ....................................... 360/234.4
See application file for complete search history.

(56) References Cited

U.S. PATENT DOCUMENTS

| | | |
|---|---|---|
| 4,836,435 A | 6/1989 | Napp et al. |
| 5,197,654 A | 3/1993 | Katz et al. |
| 5,208,186 A | 5/1993 | Mathew |
| 5,311,405 A | 5/1994 | Tribbey et al. |
| 6,054,653 A | 4/2000 | Hansen et al. |
| 6,075,673 A | 6/2000 | Wilde et al. |
| 6,097,575 A | 8/2000 | Trang et al. |
| 6,125,014 A | 9/2000 | Riedlin, Jr. |
| 6,125,015 A | 9/2000 | Carlson et al. |
| 6,130,863 A * | 10/2000 | Wang et al. ................. 369/13.23 |
| 6,137,656 A | 10/2000 | Levi et al. |
| 6,144,528 A | 11/2000 | Anaya-Dufresne et al. |
| 6,147,838 A | 11/2000 | Chang et al. |
| 6,151,196 A | 11/2000 | Carlson et al. |
| 6,178,064 B1 | 1/2001 | Chang et al. |
| 6,181,522 B1 | 1/2001 | Carlson |
| 6,181,673 B1 * | 1/2001 | Wilde et al. ................... 369/300 |
| 6,229,672 B1 | 5/2001 | Lee et al. |
| 6,236,543 B1 | 5/2001 | Han et al. |
| 6,246,547 B1 | 6/2001 | Bozorgi et al. |
| 6,249,404 B1 | 6/2001 | Doundakov et al. |
| 6,250,541 B1 | 6/2001 | Shangguan et al. |
| 6,274,407 B1 | 8/2001 | Baker et al. |
| 6,330,131 B1 | 12/2001 | Nepela et al. |
| 6,339,518 B1 | 1/2002 | Chang et al. |
| 6,349,017 B1 | 2/2002 | Schott |
| 6,373,660 B1 | 4/2002 | Lam et al. |
| 6,378,195 B1 | 4/2002 | Carlson |
| 6,391,770 B2 | 5/2002 | Kosaki et al. |
| 6,522,504 B1 | 2/2003 | Casey |

(Continued)

*Primary Examiner* — Mark Blouin

(57) ABSTRACT

A substrate assembly includes a chip coupled with a carrier, a substrate having a first surface and an opposing second surface, and a support structure mounted to the second surface of the substrate and in contact with the carrier. A method of bonding a chip and carrier assembly to a substrate includes contacting the chip and carrier assembly with the bond material and applying heat and force on the chip and carrier assembly until the support structure is mounted on the second surface of the substrate and in contact with the carrier. A substrate assembly includes a chip coupled with a carrier, a substrate having a first surface and an opposing second surface, and one of the carrier or the substrate comprising a trench having a periphery, wherein the second surface of the substrate supports the carrier along the periphery of the trench.

27 Claims, 20 Drawing Sheets

(56) References Cited

U.S. PATENT DOCUMENTS

| | | |
|---|---|---|
| 6,538,850 B1 | 3/2003 | Hadian et al. |
| 6,583,019 B2 | 6/2003 | Vandermeulen et al. |
| 6,583,953 B1 | 6/2003 | Han et al. |
| 6,587,314 B1 * | 7/2003 | Lille .............................. 360/313 |
| 6,646,832 B2 | 11/2003 | Anaya-Dufresne et al. |
| 6,661,612 B1 | 12/2003 | Peng |
| 6,665,146 B2 | 12/2003 | Hawwa et al. |
| 6,690,545 B1 | 2/2004 | Chang et al. |
| 6,704,173 B1 | 3/2004 | Lam et al. |
| 6,708,389 B1 | 3/2004 | Carlson et al. |
| 6,717,773 B2 | 4/2004 | Hawwa et al. |
| 6,721,142 B1 | 4/2004 | Meyer et al. |
| 6,740,822 B2 | 5/2004 | Watanabe |
| 6,744,599 B1 | 6/2004 | Peng et al. |
| 6,771,468 B1 | 8/2004 | Levi et al. |
| 6,796,018 B1 | 9/2004 | Thornton |
| 6,801,402 B1 | 10/2004 | Subrahmanyam et al. |
| 6,856,489 B2 | 2/2005 | Hawwa et al. |
| 6,873,496 B1 | 3/2005 | Sun et al. |
| 6,912,103 B1 | 6/2005 | Peng et al. |
| 6,930,389 B2 | 8/2005 | Huang |
| 6,937,439 B1 | 8/2005 | Chang et al. |
| 6,956,718 B1 | 10/2005 | Kulkarni et al. |
| 6,972,930 B1 | 12/2005 | Tang et al. |
| 7,006,330 B1 | 2/2006 | Subrahmanyam et al. |
| 7,006,331 B1 | 2/2006 | Subrahmanyam et al. |
| 7,010,847 B1 | 3/2006 | Hadian et al. |
| 7,019,945 B1 | 3/2006 | Peng et al. |
| 7,027,264 B1 | 4/2006 | Subrahmanyam et al. |
| 7,085,104 B1 | 8/2006 | Hadian et al. |
| 7,099,117 B1 | 8/2006 | Subrahmanyam et al. |
| 7,174,622 B2 | 2/2007 | Meyer et al. |
| 7,196,356 B2 | 3/2007 | Ishii et al. |
| 7,276,740 B2 | 10/2007 | Kim et al. |
| 7,289,299 B1 | 10/2007 | Sun et al. |
| 7,307,816 B1 | 12/2007 | Thornton et al. |
| 7,315,435 B1 | 1/2008 | Pan |
| 7,315,436 B1 | 1/2008 | Sanchez |
| 7,368,666 B2 | 5/2008 | Takeda |
| 7,414,814 B1 | 8/2008 | Pan |
| 7,436,631 B1 | 10/2008 | Fanslau, Jr. et al. |
| 7,462,861 B2 | 12/2008 | Slater, Jr. et al. |
| 7,474,508 B1 | 1/2009 | Li et al. |
| 7,477,486 B1 | 1/2009 | Sun et al. |
| 7,502,397 B2 | 3/2009 | Naganuma |
| 7,593,190 B1 | 9/2009 | Thornton et al. |
| 7,595,963 B1 | 9/2009 | Chen et al. |
| 7,616,405 B2 | 11/2009 | Hu et al. |
| 7,642,121 B2 | 1/2010 | Slater, Jr. et al. |
| 7,729,089 B1 | 6/2010 | Hogan |
| 7,768,131 B1 | 8/2010 | Hsu et al. |
| 7,843,074 B2 | 11/2010 | Gao et al. |
| 7,995,310 B1 | 8/2011 | Pan |
| 8,014,103 B2 | 9/2011 | Ohsawa et al. |
| 8,081,400 B1 | 12/2011 | Hu |
| 8,087,973 B1 | 1/2012 | Sladek et al. |
| 8,089,730 B1 | 1/2012 | Pan et al. |
| 8,164,858 B1 | 4/2012 | Moravec et al. |
| 8,199,437 B1 | 6/2012 | Sun et al. |
| 8,208,224 B1 | 6/2012 | Teo et al. |
| 8,218,268 B1 | 7/2012 | Pan |
| 8,240,545 B1 | 8/2012 | Wang et al. |
| 8,256,272 B1 | 9/2012 | Roajanasiri et al. |
| 8,295,012 B1 | 10/2012 | Tian et al. |
| 8,295,013 B1 | 10/2012 | Pan et al. |
| 8,295,014 B1 | 10/2012 | Teo et al. |
| 8,320,084 B1 | 11/2012 | Shum et al. |
| 8,325,446 B1 | 12/2012 | Liu et al. |
| 8,325,447 B1 | 12/2012 | Pan |
| 8,339,742 B1 | 12/2012 | Sladek et al. |
| 8,339,747 B1 | 12/2012 | Hales et al. |
| 8,339,748 B2 | 12/2012 | Shum et al. |
| 8,343,363 B1 | 1/2013 | Pakpum et al. |
| 8,345,519 B1 | 1/2013 | Pan |
| 8,418,353 B1 | 4/2013 | Moravec et al. |
| 8,441,896 B2 | 5/2013 | Wang et al. |
| 8,446,694 B1 | 5/2013 | Tian et al. |
| 8,456,643 B2 | 6/2013 | Prabhakaran et al. |
| 8,456,776 B1 | 6/2013 | Pan |
| 8,456,961 B1 * | 6/2013 | Wang et al. ................ 369/13.01 |
| 8,456,969 B1 * | 6/2013 | Mooney et al. ............ 369/13.33 |
| 8,462,462 B1 | 6/2013 | Moravec et al. |
| 8,462,594 B1 * | 6/2013 | Aoki et al. ................. 369/13.33 |
| 8,477,459 B1 | 7/2013 | Pan |
| 8,485,579 B2 | 7/2013 | Roajanasiri et al. |
| 8,488,279 B1 | 7/2013 | Pan et al. |
| 8,488,281 B1 | 7/2013 | Pan |
| 8,490,211 B1 | 7/2013 | Leary |
| 8,514,522 B1 | 8/2013 | Pan et al. |
| 8,533,936 B1 | 9/2013 | Puttichaem et al. |
| 8,545,164 B2 | 10/2013 | Choumwong et al. |
| 8,553,365 B1 | 10/2013 | Shapiro et al. |
| 8,570,843 B2 * | 10/2013 | Hirata et al. ............... 369/13.33 |
| 8,587,901 B1 | 11/2013 | Puttichaem et al. |
| 8,593,764 B1 | 11/2013 | Tian et al. |
| 8,599,653 B1 | 12/2013 | Mallary et al. |
| 8,605,387 B2 * | 12/2013 | Hirata et al. ............. 360/125.31 |
| 8,605,389 B1 | 12/2013 | Pan et al. |
| 8,611,050 B1 | 12/2013 | Moravec et al. |
| 8,611,052 B1 | 12/2013 | Pan et al. |
| 8,623,197 B1 | 1/2014 | Kobsiriphat et al. |
| 8,624,184 B1 | 1/2014 | Souza et al. |
| 8,665,566 B1 | 3/2014 | Pan et al. |
| 8,665,567 B2 | 3/2014 | Shum et al. |
| 8,665,677 B1 * | 3/2014 | Panitchakan et al. ...... 369/13.17 |
| 8,665,690 B1 | 3/2014 | Moravec et al. |
| 8,687,469 B1 * | 4/2014 | Takayama et al. ......... 369/13.24 |
| 8,693,144 B1 | 4/2014 | Pan et al. |
| 8,756,795 B1 | 6/2014 | Moravec et al. |
| 8,758,083 B1 | 6/2014 | Rudy et al. |
| 8,760,812 B1 | 6/2014 | Chen et al. |
| 8,770,463 B1 | 7/2014 | Puttichaem et al. |
| 8,773,664 B1 | 7/2014 | Wang et al. |
| 8,792,212 B1 | 7/2014 | Pan et al. |
| 8,792,213 B1 | 7/2014 | Vijay et al. |
| 8,797,691 B1 | 8/2014 | Tian et al. |
| 2004/0029304 A1 | 2/2004 | Naydenkov et al. |
| 2005/0121806 A1 | 6/2005 | Sangiorgi |
| 2007/0273025 A1 | 11/2007 | Bellaiche |
| 2009/0091024 A1 | 4/2009 | Zeng et al. |
| 2013/0244541 A1 | 9/2013 | Yaemglin et al. |
| 2013/0293982 A1 | 11/2013 | Huber |

* cited by examiner

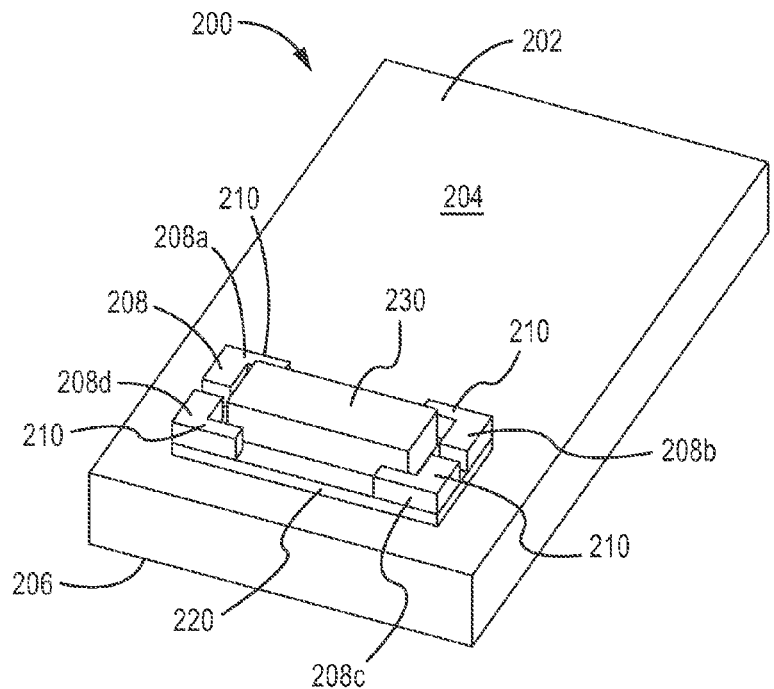
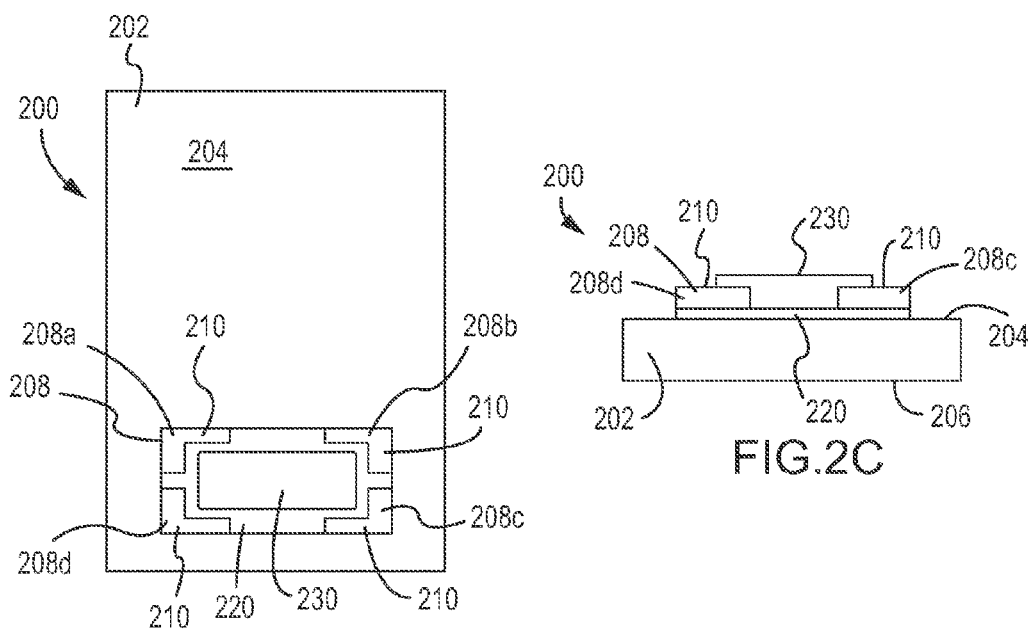

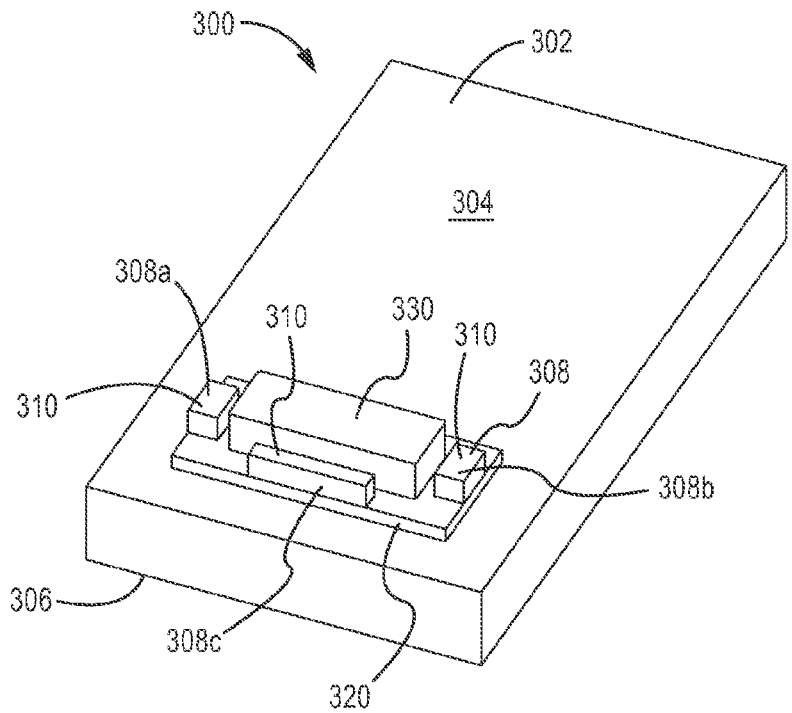
FIG.3A
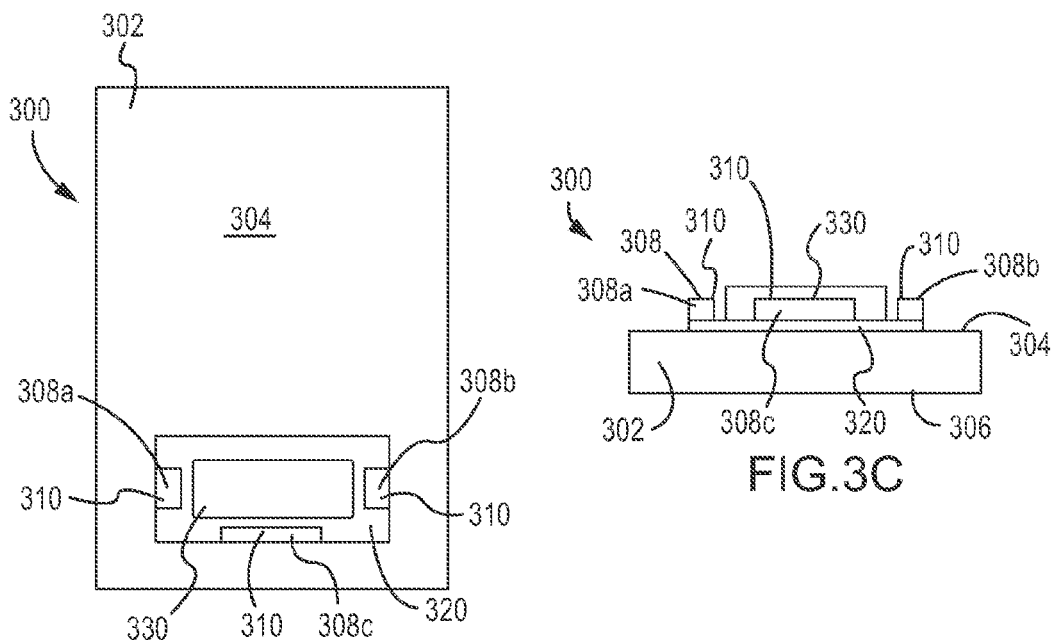
FIG.3B
FIG.3C

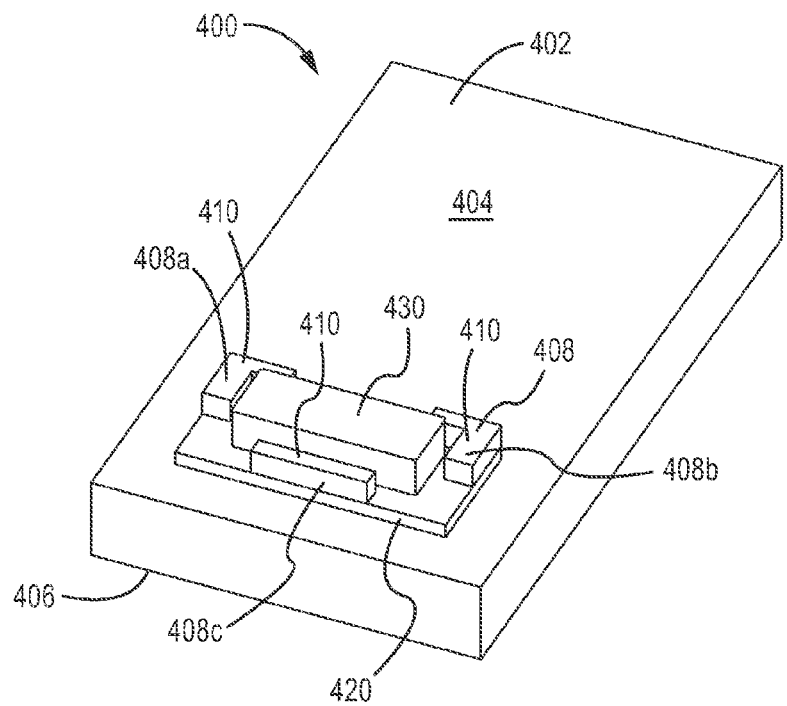
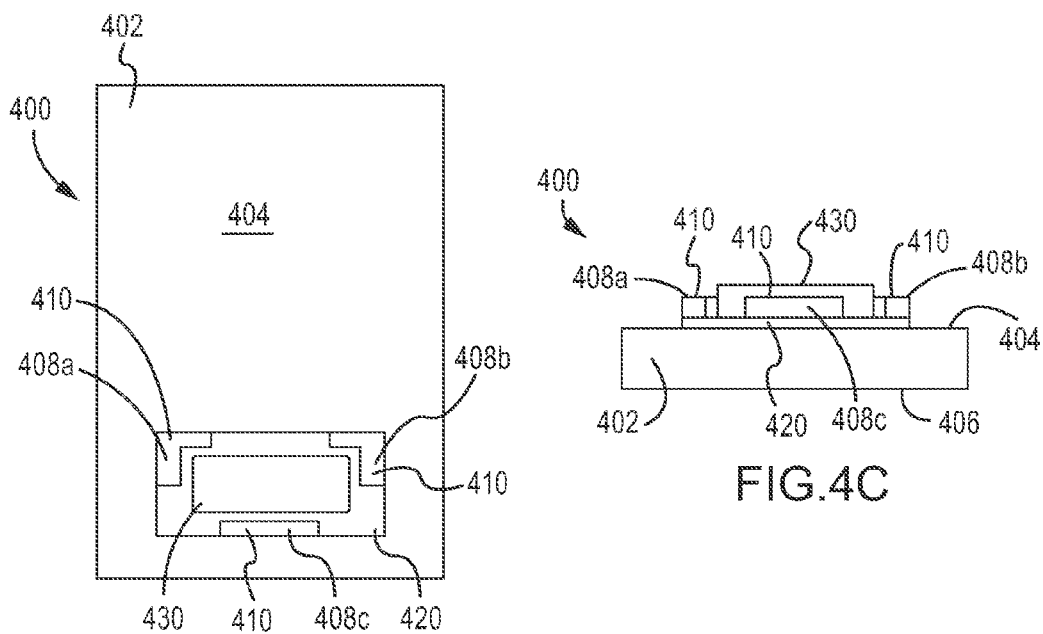

US 9,257,138 B1

SLIDER ASSEMBLY AND METHOD OF MANUFACTURING SAME

BACKGROUND

The disclosure relates to heat assisted magnetic recording (HAMR), and particularly to alignment features and assembly methods to improve placement accuracy of a laser Chip-On-Submount Assembly (COSA) on a magnetic recording write head assembly.

Information storage devices are used to retrieve and/or store data in computers and other consumer electronics devices. Energy assisted magnetic recording (EAMR) or heat assisted magnetic recording (HAMR) technology may be used to increase areal density (AD) of hard disks.

Heat assisted magnetic recording technology requires a laser source to provide additional energy during the data writing process. The energy source normally comes from a semiconductor laser diode chip bonded on a submount assembly which is referred to as the Chip-On-Submount-Assembly (COSA). The COSA is attached to the back of a conventional magnetic head slider and the light energy from the laser diode chip is guided to an air bearing surface (ABS) through a waveguide to heat up the magnetic media. Heat from the laser beam lowers the coercivity of the magnetic medium and enables a write pole to magnetize the media with high density, which helps to realize the magnetic recording process with increased AD.

Efficient coupling of the laser beam with the optical waveguide enables writing data at high density to the disk. A requirement for bonding the COSA to the slider is the accuracy which must be achieved, typically at a submicron level. Accurate bonding helps to ensure that the output of the laser diode is aligned to the entry point of the waveguide attached to the slider. The alignment accuracy defines the amount of energy channeled into the waveguide and therefore an efficiency of the whole assembly. When the alignment is poor, more energy is needed from the laser diode to ensure sufficient energy is channeled through the waveguide. Poor alignment leads to low energy efficiency and potential degradation of laser life due to higher required output.

Another aspect impacting efficiency of light coupling into the waveguide is the distance or gap between the laser diode and the waveguide entry point. Due to the large divergence angle of the laser beam, it is desirable to have a gap between the laser diode and slider. However, conventional methods of bonding the COSA to the slider while leaving a gap between the laser diode lead to several problems. For example, the laser diode may crash into the slider during the bonding or the COSA may tilt relative to the slider thereby causing a misalignment between the laser diode and the waveguide.

Thus, there is a need in the art for methods and apparatuses to facilitate alignment of the laser COSA with the optical waveguide and avoiding crashing of a laser diode with the slider.

BRIEF DESCRIPTION OF THE DRAWINGS

Various aspects of the present invention will now be presented in the detailed description by way of example, and not by way of limitation, with reference to the accompanying drawings, wherein:

FIG. 2A is a conceptual perspective view of an exemplary embodiment of a slider assembly prior to bonding a COSA to the slider assembly.

FIG. 2B is a conceptual top view of the exemplary embodiment of the slider assembly of FIG. 2A.

FIG. 2C is a conceptual front view of the exemplary embodiment of the slider assembly of FIG. 2A.

FIG. 3A is a conceptual perspective view of another exemplary embodiment of a slider assembly prior to bonding a COSA to the slider assembly.

FIG. 3B is a conceptual top view of the exemplary embodiment of the slider assembly of FIG. 3A.

FIG. 3C is a conceptual front view of the exemplary embodiment of the slider assembly of FIG. 3A.

FIG. 4A is a conceptual perspective view of another exemplary embodiment of a slider assembly prior to bonding a COSA to the slider assembly.

FIG. 4B is a conceptual top view of the exemplary embodiment of the slider assembly of FIG. 4A.

FIG. 4C is a conceptual front view of the exemplary embodiment of the slider assembly of FIG. 4A.

DETAILED DESCRIPTION

Figure 1:
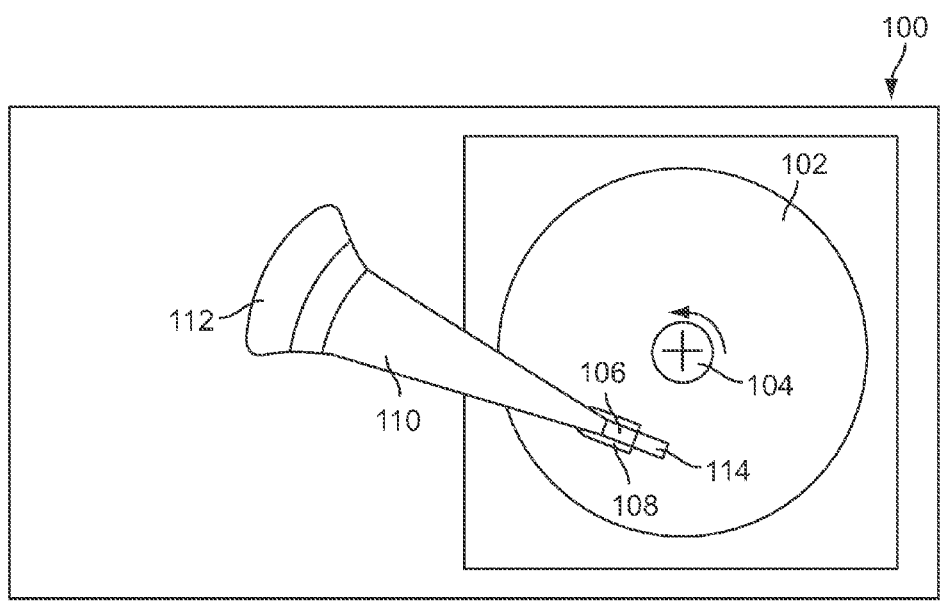
FIG. 1 is a plan view of an exemplary embodiment of a HAMR disk drive.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus or method.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus, method or article of manufacture does not require that all embodiments of the invention include the described components, structure, features, functionality, processes, advantages, benefits, or modes of operation.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the terms "comprises," "comprising," "includes," and/or "including," when used herein, specify the presence of the stated features, integers, steps, operations, elements, and/or components, but do not preclude the presence or addition of one or more other features, integers, steps, operations, elements, components, and/or groups thereof.

In the following detailed description, various aspects of the present invention will be presented in the context of apparatuses and methods to improve alignment of a laser COSA with an optical waveguide on a slider of a magnetic disk drive write head assembly. However, those skilled in the art will realize that these aspects may be extended to any suitable application where support structures may be used to assist or facilitate a machine in the alignment or placement of a structure, component, or part, onto an apparatus. Accordingly, any reference to a process for improving alignment of a laser COSA with an optical waveguide on a slider is intended only to illustrate the various aspects of the present invention, with the understanding that such aspects may have a wide range of applications. For example, the apparatuses and methods described herein may be applicable to the field of optical communications.

Aspects of a substrate assembly include a chip coupled with a carrier, a substrate having a first surface and an opposing second surface, and a support structure mounted to the second surface of the substrate and in contact with the carrier.

Aspects of method of bonding a chip and carrier assembly to a substrate, the substrate having a first surface and an opposing second surface and a bond material on the second surface, and one of the chip and carrier assembly or the substrate having a support structure, includes contacting the chip and carrier assembly with the bond material, and applying heat and force on the chip and carrier assembly until the support structure is mounted on the second surface of the substrate and in contact with the carrier.

Aspects of a substrate assembly include a chip coupled with a carrier, a substrate having a first surface and an opposing second surface, and one of the carrier or the substrate comprising a trench having a periphery. The second surface of the substrate supports the carrier along the periphery of the trench.

Aspects of a method of bonding a chip and carrier assembly to a substrate, the substrate having a first surface and an opposing second surface, one of the chip and carrier assembly or the substrate comprising a trench having a periphery, and a bond material at least partially disposed within the trench, includes contacting the chip and carrier assembly with the bond material, and applying heat and force on the chip and carrier assembly until the second surface of the substrate supports the chip and carrier assembly along the periphery of the trench.

It is understood that other aspects of apparatuses and methods will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive FIG. 1 is a conceptual plan view of an exemplary embodiment of a HAMR disk drive. The HAMR disk drive 100 is shown with a rotatable magnetic disk 102. The magnetic disk 102 may be rotated on a spindle 104 by a disk drive motor (not shown) located under the magnetic disk 102. A head 106 may include read and write poles (not shown) that detect and modify the magnetic polarization of the recording layer on the disk's surface. The head 106 is generally integrally formed with a slider 108 (also referred herein as a "substrate," which refers to contexts in addition to a hard disk drive). The function of the slider 108 is to support the head 106 and any electrical connections between the head 106 and the rest of the HAMR disk drive 100. The slider 108 is mounted to a positioner arm 110 which may be used to move the head 106 on an arc across the rotating magnetic disk 102, thereby allowing the head 106 to access the entire surface of the magnetic disk 102. The arm 110 may be moved using a voice coil actuator 112 or by some other suitable means.

The slider is aerodynamically designed to fly above the magnetic disk 102 by virtue of an air bearing created between the surface of the slider 108 and the rotating magnetic disk 102. This surface of the slider 108 is referred to as an air bearing surface (ABS). The ABS is the portion of the slider 108 surface which is closest to the rotating magnetic disk 102, which is typically the head 106. A HAMR transducer 114 may be coupled to the trailing edge of the slider 108 to assist writing data to the magnetic disk 102. Light from a laser diode is coupled to the HAMR transducer 114 and guided by waveguide (not shown) to the magnetic disk 102 to heat a small region of the media. The head 106 magnetically writes data to the heated region of the media by energizing the write pole. When the laser diode, as the heat source, is turned off, the localized magnetic media cools and the written bit becomes thermally stable at ambient temperature.

FIG. 2A is a conceptual perspective view of an exemplary embodiment of a slider assembly 200 prior to mounting a COSA on the slider assembly 200. The COSA is also referred herein a chip and carrier assembly and refers to contexts in addition to a hard disk drives. FIG. 2B is a conceptual top view of the exemplary embodiment of the slider assembly 200. FIG. 2C is a front view of the exemplary embodiment of the slider assembly 200. The slider assembly 200 may include a slider 202 having a back surface 204. The back surface 204 may oppose an ABS surface 206. The slider 202 may include a support structure 208 mounted to the back surface 204 configured to receive a COSA. As best seen in FIGS. 2A and 2C, the support structure 208 may project from the back surface 204 in a direction away from the ABS 206. The support structure may include a plurality of separate components. As shown in FIG. 2B, the support structure 208 may include four separate components 208a, 208b, 208c, 208d. Each of the separate components 208a, 208b, 208c, 208d may include a mounting surface 210 for receiving a portion of an underside surface of the COSA. The mounting surfaces 210 may be substantially flat. The height of each of the separate components 208a, 208b, 208c, 208d of the support structure 208 may be identical such that the surfaces 210 all lie in a common plane. By lying in a common plane, the separate components 208a, 208b, 208c, 208d provide a stable mounting surface for the COSA. Thus, the separate comments 208a, 208b, 208c, 208d provide four contact points for the COSA.

The slider assembly 200 may further include an under bond material 220 located on the back surface 204 of the slider 202. As shown in FIGS. 2A-2C, the under bond material 220 may be directly in contact with the back surface 204 of the slider 202 (e.g., such that there is no intervening layer between the back surface 204 and the under bond material 220). The under bond material 220 may have a substantially rectangular shape. The separate components 208a, 208b, 208c, 208d of the support structure 208 may be located on the under bond material 220. The separate components 208a, 208b, 208c, 208d of the support structure 208 may be in direct contact with the under bond material 220 (e.g., such that there is no intervening layer between the under bond material 220 and the separate components 208a, 208b, 208c, 208d). As shown in FIG. 2B, each of the separate components 208a, 208b, 208c, 208d may be located at the perimeter of the under bond material 220, for example at one of the four corners of the rectangular shaped under bond material 220. Each of the separate components 208a, 208b, 208c, 208d may have a substantially "L" shape so as to cover both a portion of a horizontal edge and a vertical edge (e.g. cover a corner) of the rectangular shaped under bond material 220. While each of the separate components of the support structure are shown as only being in contact with the under bond material, in another exemplary embodiment, the support structure (including one or more or all of the separate components) may be positioned adjacent the under bond material such that the support structure is only in contact with the back surface of the slider. In yet another exemplary embodiment, the support structure (including one or more or all of the separate components) may be positioned such that the support structure is in contact with both the under bond material and the back surface of the slider.

The slider assembly 200 may further a bond material 230 located on the back surface 204 of the slider 202. Thus, the back surface 204 of the slider 202 may support the bond material 230. The bond material 230 may comprise a solder material. The bond material 230 may be in direct contact with the under bond material 220 (e.g., such that there is no intervening layer between the under bond material 220 and the bond material 230). As shown in FIG. 2B, the bond material 230 may have a substantially rectangular shape. The bond material 230 may have the same shape as the under bond material 220. As shown in FIGS. 2A and 2C, the bond materials 230 may be several times thicker than the under bond material 230, for example two to five times thicker. As shown in FIG. 2B the bond material 230 may have a smaller surface area than the under bond material 230. For example the area of the bond material 230 may be about two-thirds to about three-quarters the area of the under bond material 220. Thus, about one-quarter to about one-third of the surface area of the under bond material 220 may be uncovered with respect to the bond material 230.

As noted above, FIGS. 2A-2C shows the slider assembly 200 prior to bonding a COSA to the slider assembly 200. During the bonding process, which is described in more detail below, the bond material 230 is heated and pressurized such that the bonding material 230 becomes thinner and covers more surface area of the under bonding material 220. Accordingly, as shown in FIGS. 2A and 2C, the bonding material 230 may have an initial thickness that extends beyond the thickness of each of the separate components 208a, 208b, 208c, 208d of the supporting member 208, while also being spaced away from the separate components 208a, 208b, 208c, 208d to allow for the redistribution of the bonding material 230. In other words, the top surface of the bond material may have an initial elevation that is higher than an elevation of the top surface of the support structure (including the top surface of each of the separate components of the support structure).

FIG. 3A is a conceptual perspective view of another exemplary embodiment of a slider assembly 300 prior to mounting a COSA on the slider assembly 300. FIG. 3B is a conceptual top view of the exemplary embodiment of the slider assembly 300. FIG. 3C is a front view of the exemplary embodiment of the slider assembly 300. The slider assembly 300 may include a slider 302 having a back surface 304. The back surface 304 may oppose an ABS surface 306. The slider 302 may include a support structure 308 mounted to the back surface 304 of the slider 302 configured to receive a COSA. As best seen in FIGS. 3A and 3C, the support structure 308 may project from the back surface 304 in a direction away from the ABS 306. The support structure may include a plurality of separate components. As shown in FIG. 3B, the support structure 308 may include three separate components 308a, 308b, 308c. Each of the separate components 308a, 308b, 308c may include a mounting surface 310 for receiving a portion of an underside surface of the COSA. The mounting surfaces 310 may be substantially flat. The height of each of the separate components 308a, 308b, 308c of the support structure 308 may be identical such that the surfaces 310 all lie in a common plane. By lying in a common plane, the separate components 308a, 308b, 308c provide a stable mounting surface for the COSA. Thus, the separate comments 308a, 308b, 308c provide three contact points for the COSA.

The slider assembly 300 may further include an under bond material 320 located on the back surface 304 of the slider 302. As shown in FIGS. 3A-3C, the under bond material 320 may be directly in contact with the back surface 304 of the slider 302 (e.g., such that there is no intervening layer between the back surface 304 and the under bond material 320). The under bond material 320 may have a substantially rectangular shape. The separate components 308a, 308b, 308c of the support structure 308 may be located on the under bond material 320. The separate components 308a, 308b, 308c of the support structure 308 may be in direct contact with the under bond material 320 (e.g., such that there is no intervening layer between the under bond material 320 and the separate components 308a, 308b, 308c). As shown in FIG. 3B, each of the separate components 308a, 308b, 208c may be located at the perimeter of the under bond material 320, for example on different edges of the rectangular shaped under bond material 320. Each of the separate components 308a, 308b, 308c, 308d may have a substantially rectangular shape so as to cover either a portion of a horizontal or a vertical edge (in the orientation of FIG. 3B) of the rectangular shaped under bond material 220. As shown in FIG. 3B, two components 308a, 308b of the separate components may be located on opposing edges of the shorter of the rectangular shaped under bond material 320. A third component 308c of the separate components may be located on one of the longer edges of the rectangular shaped under bond material 320. Furthermore, each of the separate components 308a, 308b, 308c may be located substantially midway along the length of the respective edge of the rectangular under bond material 320. As shown in FIG. 3B the component 308c may have a longer length than the components 308a, 308b because it is located on the longer edge of the rectangular under bond material 320. While each of the separate components of the support structure are shown as only being in contact with the under bond material, in another exemplary embodiment, the support structure (including one or more or all of the separate components) may be positioned adjacent the under bond material such that the support structure is only in contact with the back surface of the slider. In yet another exemplary embodiment, the support structure (including one or more or all of the separate components) may be positioned such that the support structure is in contact with both the under bond material and the back surface of the slider.

The slider assembly 300 may further a bond material 330 located on the back surface 304 of the slider 302. Thus, the back surface 304 of the slider 302 may support the bond material 330. The bond material 330 may comprise a solder material. The bond material 330 may be in direct contact with the under bond material 320 (e.g., such that there is no intervening layer between the under bond material 320 and the bond material 330. As shown in FIG. 3B, the bond material 330 may have a substantially rectangular shape. The bond material 330 may have the same shape as the under bond material 320. As shown in FIGS. 3A and 3C, the bond materials 330 may be several times thicker than the under bond material 330, for example two to five times thicker. As shown in FIG. 3B the bond material 330 may have a smaller surface area than the under bond material 330. For example the area of the bond material 330 may be about two-thirds to about three-quarters the area of the under bond material 320. Thus, about one-quarter to about one-third of the surface area of the under bond material 320 may be uncovered with respect to the bond material 330.

As noted above, FIGS. 3A-3C shows the slider assembly 300 prior to bonding a COSA to the slider assembly. During the bonding process, which is described in more detail below, the bond material 330 is heated and pressurized such that the bonding material 330 becomes thinner and covers more surface area of the under bonding material 320. Accordingly, as shown in FIGS. 3A and 3C, the bonding material 330 may have an initial thickness that extends beyond the thickness of each of the separate components 308a, 308b, 308c, of the supporting member 308, while also being spaced away from the separate components 308a, 308b, 308c, to allow for the redistribution of the bonding material 330. In other words, the top surface of the bond material may have an initial elevation that is higher than an elevation of the top surface of the support structure (including the top surface of each of the separate components of the support structure).

FIG. 4A is a conceptual perspective view of another exemplary embodiment of a slider assembly 400 prior to mounting a COSA on the slider assembly 400. FIG. 4B is a conceptual top view of the exemplary embodiment of the slider assembly 400. FIG. 4C is a front view of the exemplary embodiment of the slider assembly 400. The slider assembly 400 may include a slider 402 having a back surface 404. The back surface 404 may oppose an ABS surface 406. The slider 402 may include a support structure 408 mounted to the back surface 404 of the slider 402 configured to receive a COSA. As best seen in FIGS. 4A and 4C, the support structure 408 may project from the back surface 404 in a direction away from the ABS 406. The support structure may include a plurality of separate components. As shown in FIG. 4B, the support structure 408 may include three separate components 408a, 408b, 408c. Each of the separate components 408a, 408b, 408c may include a mounting surface 410 for receiving a portion of an underside surface of the COSA. The mounting surfaces 410 may be substantially flat. The height of each of the separate components 408a, 408b, 408c of the support structure 408 may be identical such that the surfaces 410 all lie in a common plane. By lying in a common plane, the separate components 408a, 408b, 408c provide a stable mounting surface for the COSA. Thus, the separate comments 408a, 408b, 408c provide three contact points for the COSA.

The slider assembly 400 may further include an under bond material 420 located on the back surface 404 of the slider 402. As shown in FIGS. 4A-4C, the under bond material 420 may be directly in contact with the back surface 404 of the slider 402 (e.g., such that there is no intervening layer between the back surface 404 and the under bond material 420). The under bond material 420 may have a substantially rectangular shape. The separate components 408a, 408b, 408c of the support structure 408 may be located on the under bond material 420. The separate components 408a, 408b, 408c of the support structure 408 may be in direct contact with the under bond material 420 (e.g., such that there is no intervening layer between the under bond material 420 and the separate components 408a, 408b, 408c). As shown in FIG. 4B, each of the separate components 408a, 408b, 208c may be located at the perimeter of the under bond material 420.

As shown in FIG. 4B, two components 408a, 408c of the separate components may be located at one of the four corners of the rectangular shaped under bond material 420. The two components 408a, 408b of the separate components may have a substantially "L" shape so as to cover both a portion of a horizontal edge and a vertical edge (e.g., cover a corner) of the rectangular shaped under bond material 420. Further, one component 408c of the separate components may have a substantially rectangular shape so as to cover either a portion of a horizontal edge or a vertical edge (in the orientation of FIG. 4B) of the rectangular shaped under bond material 420. In the illustrated exemplary embodiment, the component 408c is located along the longer horizontal edge (in the orientation of FIG. 4B). The components 408c may be located substantially midway along the length of the edge of the rectangular under bond material 420. While each of the separate components of the support structure are shown as only being in contact with the under bond material, in another exemplary embodiment, the support structure (including one or more or all of the separate components) may be positioned adjacent the under bond material such that the support structure is only in contact with the back surface of the slider. In yet another exemplary embodiment, the support structure (including one or more or all of the separate components) may be positioned such that the support structure is in contact with both the under bond material and the back surface of the slider.

The slider assembly 400 may further a bond material 430 located on the back surface 404 of the slider 402. Thus, the back surface 404 of the slider 402 may support the bond material 430. The bond material 430 may comprise a solder material. The bond material 430 may be in direct contact with the under bond material 420 (e.g., such that there is no intervening layer between the under bond material 420 and the bond material 430. As shown in FIG. 4B, the bond material 430 may have a substantially rectangular shape. The bond material 430 may have the same shape as the under bond material 420. As shown in FIGS. 4A and 4C, the bond materials 430 may be several times thicker than the under bond material 430, for example two to five times thicker. As shown in FIG. 4B the bond material 430 may have a smaller surface area than the under bond material 430. For example the area of the bond material 430 may be about two-thirds to about three-quarters the area of the under bond material 420. Thus, about one-quarter to about one-third of the surface area of the under bond material 420 may be uncovered with respect to the bond material 430.

As noted above, FIGS. 4A-4C shows the slider assembly 400 prior to bonding a COSA to the slider assembly. During the bonding process, which is described in more detail below, the bond material 430 is heated and pressurized such that the bonding material 430 becomes thinner and covers more surface area of the under bonding material 420. Accordingly, as shown in FIGS. 4A and 4C, the bonding material 430 may have an initial thickness that extends beyond the thickness of each of the separate components 408a, 408b, 408c, of the supporting member 408, while also being spaced away from the separate components 408a, 408b, 408c, to allow for the redistribution of the bonding material 430. In other words, the top surface of the bond material may have an initial elevation that is higher than an elevation of the top surface of the support structure (including the top surface of each of the separate components of the support structure).

Figure 5A:
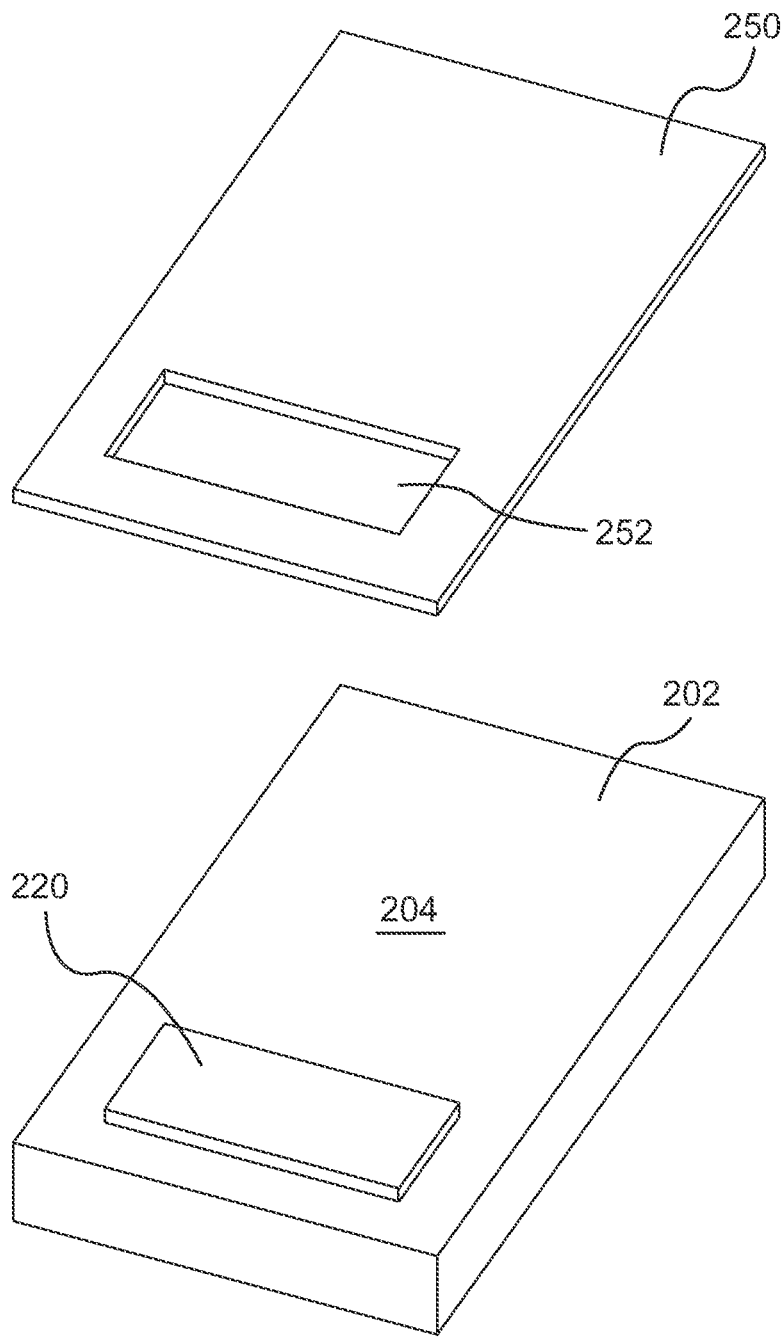
FIGS. 5A-5C are conceptual perspective views of an exemplary embodiment of a process for forming the slider assembly of FIGS. 2A-2C.
Figure 5B:
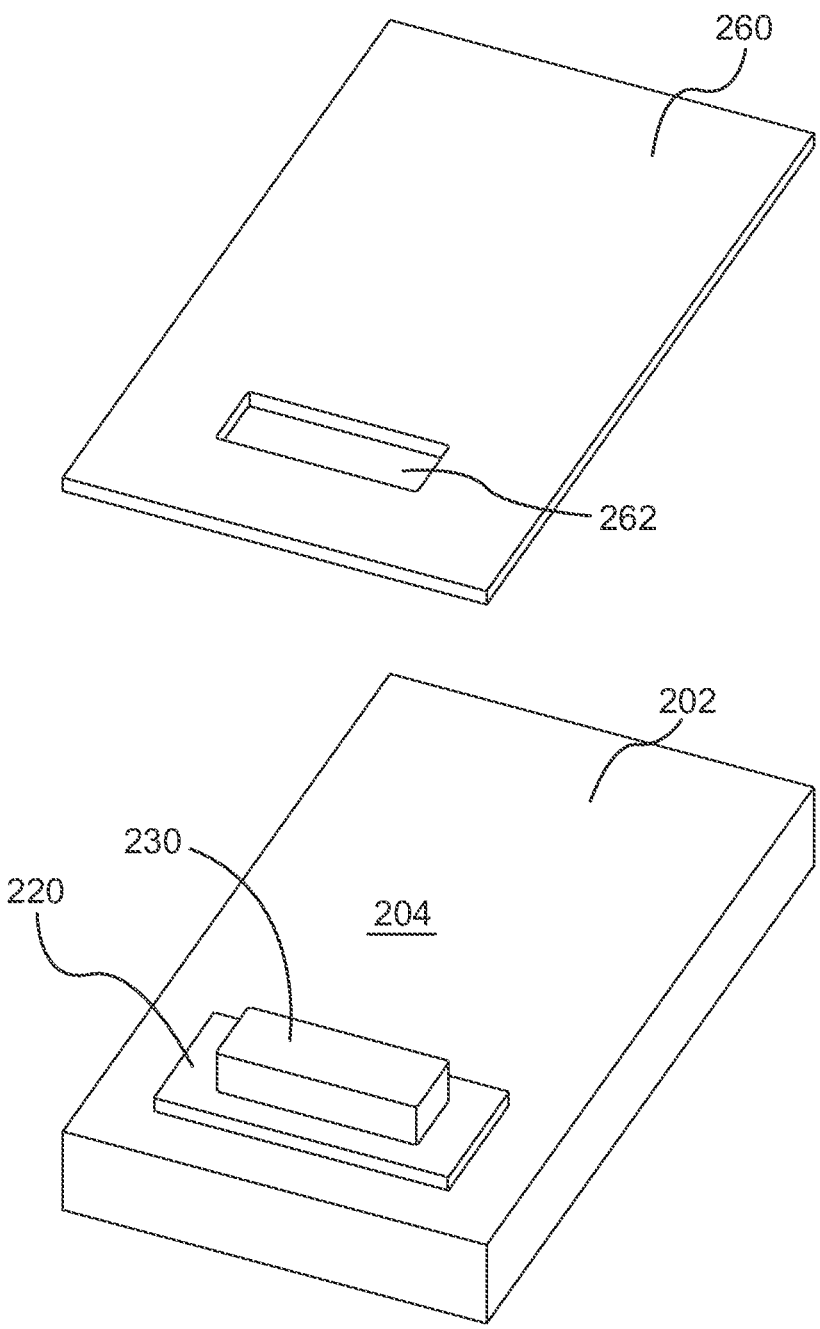
Figure 5C:
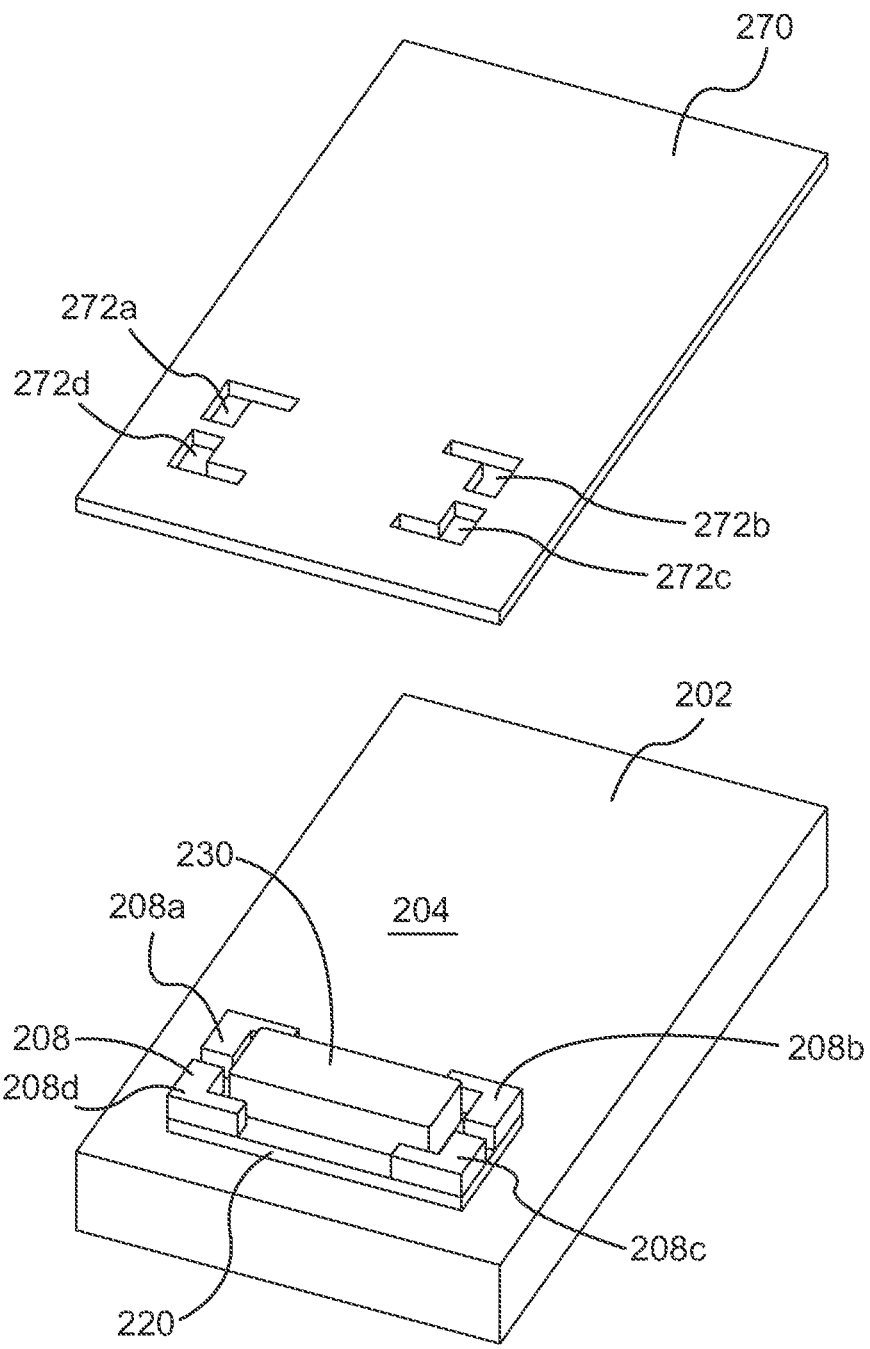

FIGS. 5A-5C are conceptual perspective views of an exemplary embodiment of a process for manufacturing the slider assembly 200 of FIGS. 2A-2C. FIG. 5A shows a first step where the under bond material 220 is applied to the back surface 204 of the slider 202. As shown in FIG. 5A, a first fabrication mask 250 having a first cutout 252 may be used to form the under bond material 220 on the back surface 204. The first fabrication mask 250 may be placed over the back surface 204 and then the under bond material may be applied over the fabrication mask 250. As shown in FIG. 5A, first cutout 252 has the same shape, size, and relative position as the desired shape, size, and relative position of the under bond material 220. Thus, when the under bond material is applied onto the first fabrication mask 250, the under bond material is only able to contact that the back surface 204 at the first cutout 252. Once the under bond material 220 has been formed, the first fabrication mask 250 may be removed.

FIG. 5B shows a second step where the bond material 230 is applied on the back surface 204 of the slider 202, for example, on the under bond material 220. As shown in FIG. 5A, a second fabrication mask 260 having a second cutout 262 may be used to form the bond material 230 on the under bond material 220. The second fabrication mask 260 may be placed over the back surface 204 and over a portion of the under bond material 230. Then, the bond material may be applied over the second fabrication mask 260. As shown in FIG. 5B, second cutout 262 has the same shape, size, and relative position as the desired shape, size, and relative position of the bond material 230. Thus, when the bond material is applied onto the second fabrication mask 260, the under bond material is only able to contact that the under bond material 220 at the first cutout 262. Once the bond material 230 has been formed, the second fabrication mask 260 may be removed.

FIG. 5C shows a third step where the support structure 208, and in particular the separate components 208a, 208b, 208c, 208d is applied to the back surface 204 of the slider 202, and specifically, on the under bond material 220. As shown in FIG. 5C, a third fabrication mask 270 having a plurality of cutouts 272a, 272b, 272c, 272d may be used to form the separate components 208a, 208b, 208c, 208d onto the under bond material 220. The third fabrication mask 270 may be placed over the back surface 204, over a portion of the under bond material 220, and over the bond material 230. Then, the support structure material may be applied over the fabrication mask 260. As shown in FIG. 5C, the plurality cutouts 272a, 272b, 272c, 272d have the shape, size, and relative position as the corresponding desired shape, size, and relative position of the separate components 208a, 208b, 208c, 208d. Thus, when the support structure material is applied onto the third fabrication mask 270, the support structure material is only able to contact that the under bond material 220 at the plurality of cutouts 272a, 272b, 272c, 272d. Once the support structure 208, including the separate components 208a, 208b, 208c, 208d have been formed, the third fabrication mask 270 may be removed.

Following the step shown in FIG. 5C, the final slider assembly 200 of FIGS. 2A-2C is formed. While FIGS. 5A-5C illustrate the fabrication method with respect to the slider assembly 200 of FIGS. 2A-2C, it should be understood that the same method may be used to fabricate the slider assembly 300 of FIGS. 3A-3C and the slider assembly 400 of FIGS. 4A-4C. The steps shown in FIGS. 5A and 5B would be the same. The method would be different in that in third step of FIG. 5C, the cutouts in the third fabrication mask would shaped, sized, and relatively positioned to match the desired shape, size, and relative position of the separate components 308a, 308b, 308c for the slider assembly 300 or the separate components 408a, 408b, 408c for the slider assembly 400.

Figure 6A:
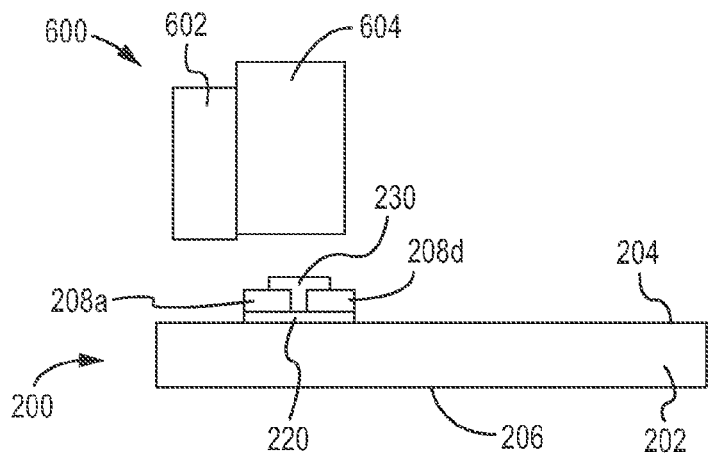
FIGS. 6A-6C are conceptual side views of an exemplary embodiment of a process for bonding a COSA onto the slider assembly of FIGS. 2A-2C.
Figure 6B:
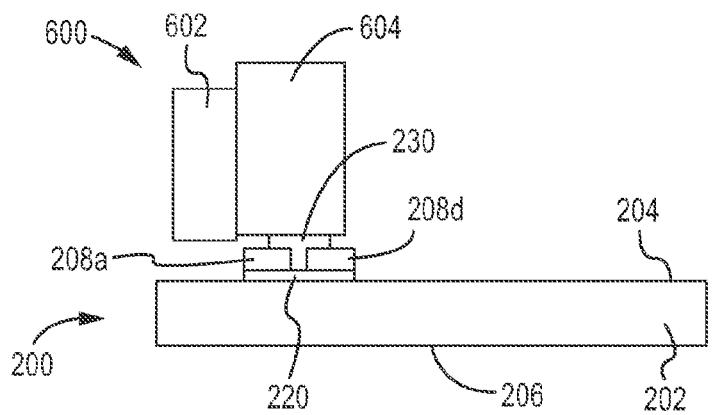
Figure 6C:
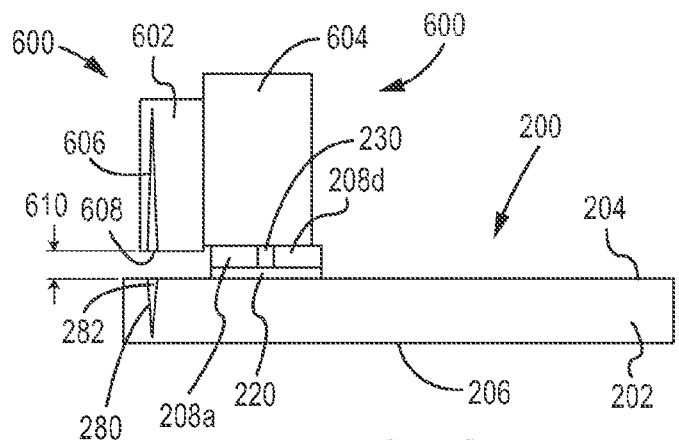

FIGS. 6A-6C are conceptual side views of an exemplary embodiment of a process for bonding a COSA 600 onto the slider assembly 200 of FIGS. 2A-2C. The COSA 600 may include a light source 602 such as a laser diode attached to a submount 604. The submount is also referred herein as a "carrier" to include contexts in addition to a hard disk drive. More detail of the COSA are shown and discussed below with reference to FIG. 6C. FIG. 6A shows a first step of the process for bonding the COSA 600 to the slider assembly 200, where the COSA 600 is aligned with the slider 202. More specifically, a quantum well of the light source 602 is aligned with a wave guide of the slider 202 (see FIG. 6C).

Turning to FIG. 6B, the submount 604 is placed on top of the bond material 230. As shown in FIG. 6B, at this point in the process, the bond material 230 may extend higher than the support structure 208 including the separate components 208a, 208b, 208c, 208d. In other words, the top surface of the bond material may have an initial elevation that is higher than an elevation of the top surface of the support structure (including the top surface of each of the separate components of the support structure). Heat may then be applied along with a bonding force on the submount 604 in a direction toward the slider 202. The combination of heat and force causes the bond material to flow and redistribute its volume. The continued application of heat and force causes the bond material to become thinner while cover a larger portion of the surface of the under bond material 230. During this motion, as the bond material 220 becomes thinner, the COSA will move closer to the separate components 208a, 208b, 208c, 208d of the support structure 208. The application of force is continually applied until the submount 604 contacts finally contacts the separate components 208a, 208b, 208c, 208d of the support structure 208.

The final position of the COSA 600 is shown in FIG. 6C. As shown in FIG. 6C, the submount is in contact with the separate components 208a, 208b, 208c, 208d of the support structure 208. The separate components 208a, 208b, 208c, 208d of the support structure 208 provide a flat plane of support for the COSA 600 and avoid unintentional tilting during the bonding. Furthermore, the separate components 208a, 208b, 208c, 208d of the support structure 208 act as a stop to prevent the light source from crashing into the slider during the bonding procedure. After the COSA 600 is mounted on the support structure 208, the redistributed bond material 230 is cooled, thereby bonding the COSA 600 to the slider 202. Further, after the mounting, the height of the bonding material is level with the height of the separate components of the support structure. In other words, the top surface of the bond material may have a final elevation that is substantially equal to an elevation of the top surface of the support structure (including the top surface of each of the separate components of the support structure).

FIG. 6C also shows details of the final assembly with the COSA 600 mounted on the support structure 208. As shown in FIG. 6C, the light source 602 includes a quantum well 606 and an emission exit 608. By mounting the submount 604 onto the support structure 208, the quantum well 606 is aligned with the wave guide 280 of the slider 202 such the emission exit 608 is aligned with the entrance 282 of the wave guide. Further, the COSA is properly positioned such that the bottom surface of the COSA 600 is parallel with the back surface 204 of the slider 202. Additionally, there is a proper gap 610 between the emission exit 608 and the wave guide entrance 282.

Figure 7A:
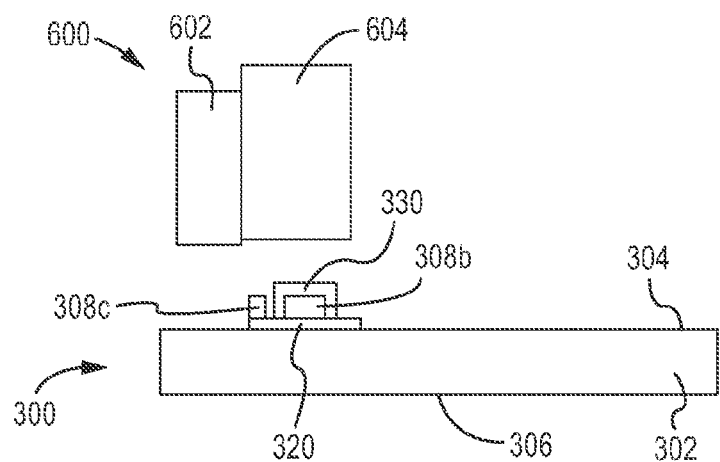
FIGS. 7A-7C are conceptual side views of an exemplary embodiment of a process for mounting a COSA onto the slider assembly of FIGS. 3A-3C.
Figure 7B:
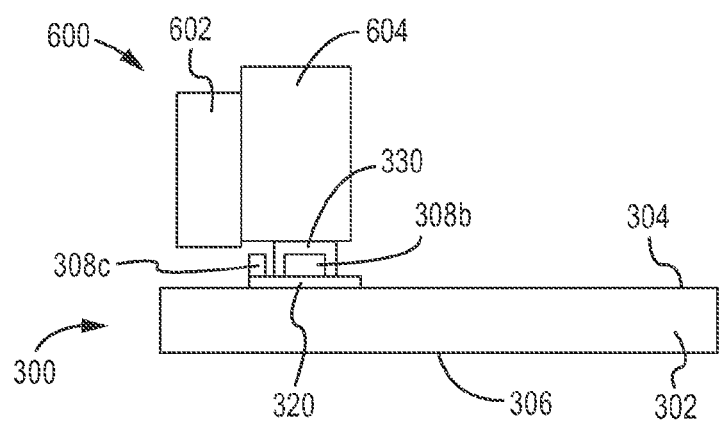
Figure 7C:
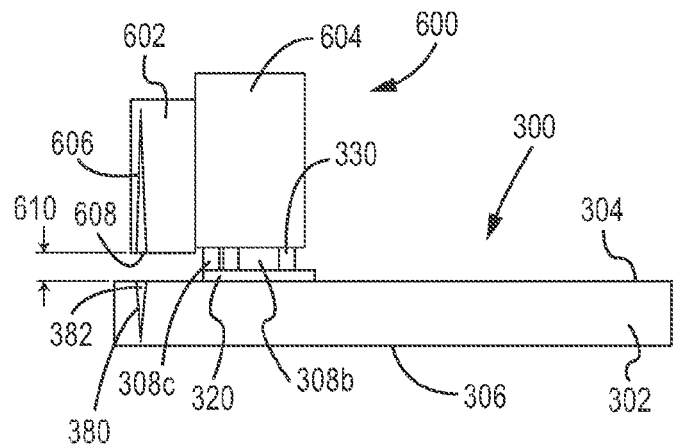

FIGS. 7A-7C are conceptual side views of an exemplary embodiment of a process for mounting a COSA 600 onto the slider assembly 300 of FIGS. 3A-3C. The COSA 600 has the same elements discussed above with respect FIGS. 6A-6C. FIG. 7A shows a first step of the process for bonding the COSA 600 to the slider assembly 300, where the COSA 600 is aligned with the slider 302. More specifically, a quantum well of the light source 602 is aligned with a wave guide of the slider 202 (see FIG. 7C).

Turning to FIG. 7B, the submount 604 is placed on top of the bond material 330. As shown in FIG. 7B, at this point in the process, the bond material 330 may extend higher than the support structure 308 including the separate components 308a, 308b, 308c. In other words, the top surface of the bond material may have an initial elevation that is higher than an elevation of the top surface of the support structure (including the top surface of each of the separate components of the support structure). Heat may then be applied along with a bonding force on the submount 604 in a direction toward the slider 302. The combination of heat and force causes the bond material to flow and redistribute its volume. The continued application of heat and force causes the bond material to become thinner while cover a larger portion of the surface of the under bond material 330. During this motion, as the bond material 320 becomes thinner, the COSA will move closer to the separate components 308a, 308b, 308c, of the support structure 308. The application of force is continually applied until the submount 604 contacts finally contacts the separate components 308a, 308b, 308c of the support structure 308.

The final position of the COSA 600 is shown in FIG. 7C. As shown in FIG. 7C, the submount 604 is in contact with the separate components 308a, 308b, 308c of the support structure 308. The separate components 308a, 308b, 308c of the support structure 308 provide a flat plane of support for the COSA 600 and avoid unintentional tilting during the bonding. Furthermore, the separate components 308a, 308b, 308c of the support structure 308 act as a stop to prevent the light source from crashing into the slider during the bonding procedure. After the COSA 600 is mounted on the support structure 308, the redistributed bond material 330 is cooled, thereby bonding the COSA 600 to the slider 302. Further, after the mounting, the height of the bonding material is level with the height of the separate components of the support structure. In other words, the top surface of the bond material may have a final elevation that is substantially equal to an elevation of the top surface of the support structure (including the top surface of each of the separate components of the support structure).

FIG. 7C also shows details of the final assembly with the COSA 600 mounted on the support structure 308. As shown in FIG. 7C, the light source 602 includes a quantum well 606 and an emission exit 608. By mounting the submount 604 onto the support structure 308, the quantum well 606 is aligned with the wave guide 380 of the slider 302 such the emission exit 608 is aligned with the entrance 382 of the wave guide. Further, the COSA is properly positioned such that the bottom surface of the COSA 600 is parallel with the back surface 304 of the slider 302. Additionally, there is a proper gap 610 between the emission exit 608 and the wave guide entrance 382.

Figure 8A:
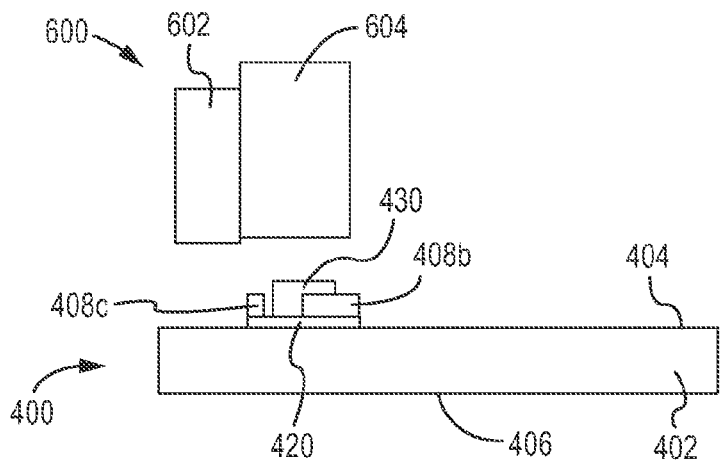
FIGS. 8A-8C are conceptual side views of an exemplary embodiment of a process for bonding a COSA onto the slider assembly of FIGS. 4A-4C.
Figure 8B:
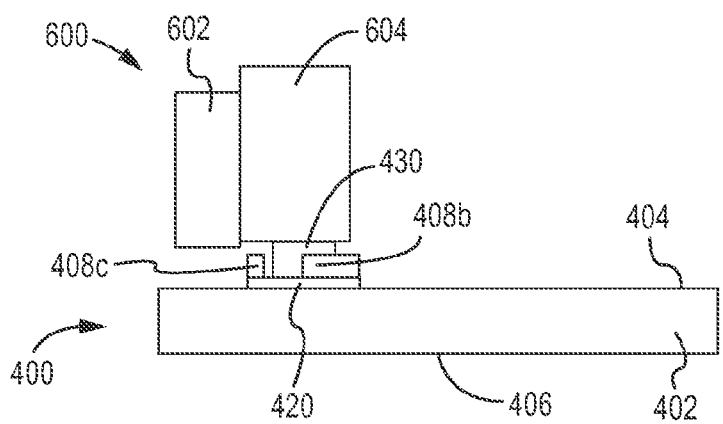
Figure 8C:
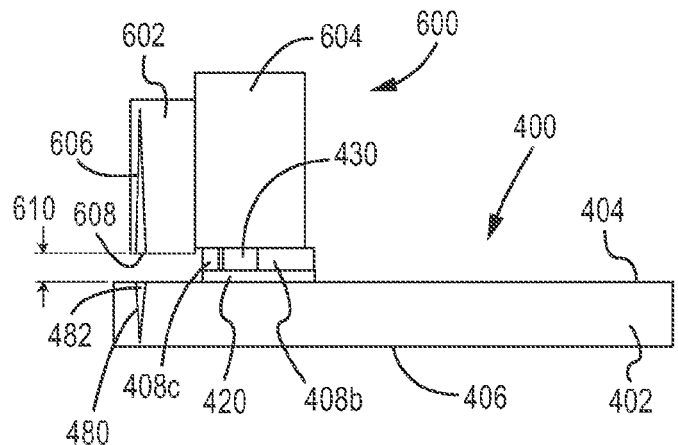

FIGS. 8A-8C are conceptual side views of an exemplary embodiment of a process for bonding a COSA 600 onto the slider assembly 400 of FIGS. 4A-4C. The COSA 600 has the same elements discussed above with respect FIGS. 6A-6C. FIG. 8A shows a first step of the process for bonding the COSA 600 to the slider assembly 400, where the COSA 600 is aligned with the slider 402. More specifically, a quantum well of the light source 602 is aligned with a wave guide of the slider 402 (see FIG. 7C).

Turning to FIG. 8B, the submount 604 is placed on top of the bond material 430. As shown in FIG. 8B, at this point in the process, the bond material 430 may extend higher than the support structure 308 including the separate components 408a, 408b, 408c. In other words, the top surface of the bond material may have an initial elevation that is higher than an elevation of the top surface of the support structure (including the top surface of each of the separate components of the support structure). Heat may then be applied along with a bonding force on the submount 604 in a direction toward the slider 402. The combination of heat and force causes the bond material to flow and redistribute its volume. The continued application of heat and force causes the bond material to become thinner while cover a larger portion of the surface of the under bond material 430. During this motion, as the bond material 430 becomes thinner, the COSA will move closer to the separate components 408a, 408b, 408c, of the support structure 408. The application of force is continually applied until the submount 604 contacts finally contacts the separate components 408a, 408b, 408c of the support structure 408.

The final position of the COSA 600 is shown in FIG. 8C. As shown in FIG. 8C, the submount 604 is in contact with the separate components 408a, 408b, 408c of the support structure 408. The separate components 408a, 408b, 408c of the support structure 408 provide a flat plane of support for the COSA 600 and avoid unintentional tilting during the bonding. Furthermore, the separate components 408a, 408b, 408c of the support structure 408 act as a stop to prevent the light source from crashing into the slider during the bonding procedure. After the COSA 600 is mounted on the support structure 308, the redistributed bond material 430 is cooled, thereby bonding the COSA 600 to the slider 402.

FIG. 8C also shows details of the final assembly with the COSA 600 mounted on the support structure 408. As shown in FIG. 7C, the light source 602 includes a quantum well 606 and an emission exit 608. By mounting the submount 604 onto the support structure 408, the quantum well 606 is aligned with the wave guide 480 of the slider 402 such the emission exit 608 is aligned with the entrance 482 of the wave guide. Further, the COSA is properly positioned such that the bottom surface of the COSA 600 is substantially parallel with the back surface 404 of the slider 402. Additionally, there is a proper gap 610 between the emission exit 608 and the wave guide entrance 482.

Figure 9A:
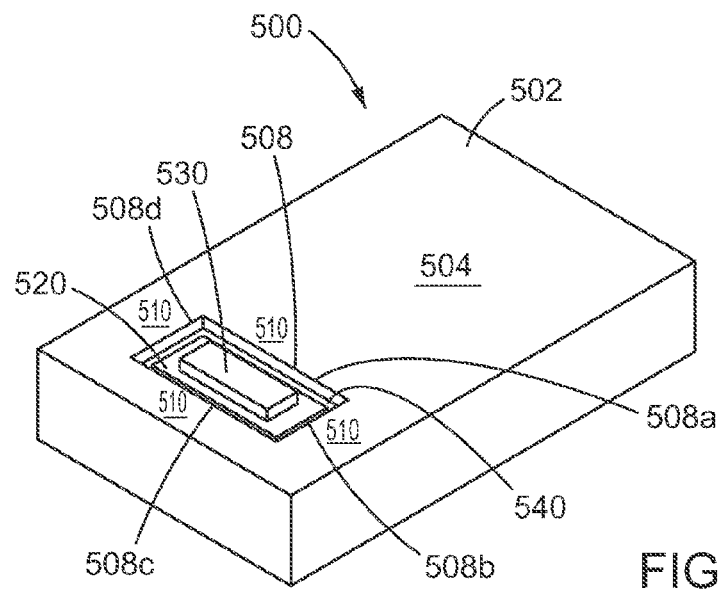
FIG. 9A is a conceptual perspective view of another exemplary embodiment of a slider assembly prior to bonding a COSA to the slider assembly.
Figure 9B:
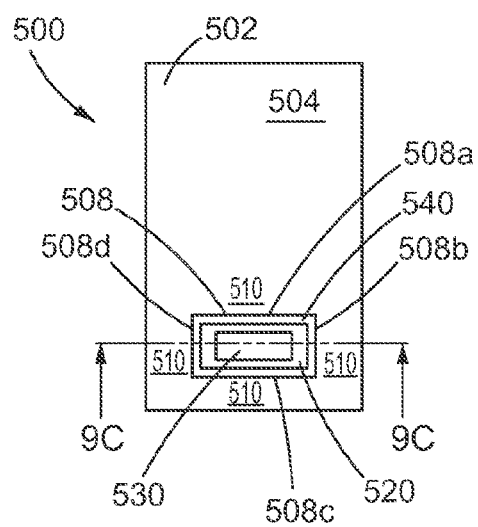
FIG. 9B is a conceptual top view of the exemplary embodiment of the slider assembly of FIG. 9A.
Figure 9C:
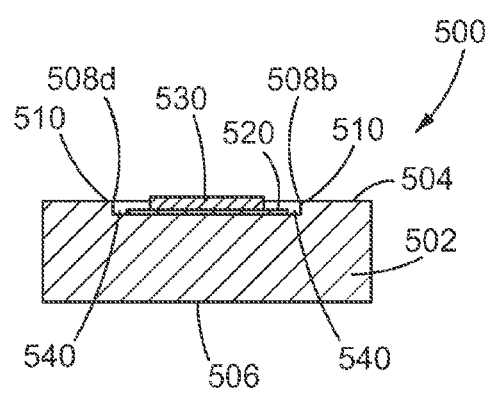
FIG. 9C is a cross sectional view taken along line 9C-9C of FIG. 9B.

FIG. 9A is a conceptual perspective view of an exemplary embodiment of a slider assembly 500 prior to mounting a COSA on a slider assembly 500. FIG. 9B is a conceptual top view of the exemplary embodiment of the slider assembly 500. FIG. 9C is a cross section view taken along line 9C-9C of FIG. 9B. The slider assembly 500 may include a slider 502 having a back surface 504. The back surface 504 may oppose an ABS surface 506. The slider 502 may include a support structure 508 integrally formed with the back surface 504 of the slider 502 configured to receive a COSA. As best seen in FIGS. 9A and 9C, the support structure 508 may be formed at the back surface 504 by a trench 540. The trench 540 may be formed by etching out the material of the slider 502 at the back surface 504. The sidewalls (e.g., the periphery) of the trenches form the support structure 508. Thus, unlike the above-discussed exemplary embodiment, the exemplary embodiment shown in FIGS. 9A-9C, the support structure 508 has a top surface at the same elevation as the back surface 504. The support structure 508 may include a plurality of edges/peripheries (e.g., defined by the sidewalls of the trench), forming, for example, a substantially rectangular shape. As shown in FIG. 9B, the support structure 508 may include four edges/peripheries 508a, 508b, 508c, 508d (e.g., four sidewalls defined by the trench 540). Each of the separate edges/peripheries 508a, 508b, 508c, 508d may include a mounting surface 510 for receiving a portion of an underside surface of the COSA. The mounting surfaces 510 may be substantially flat. As discussed above, because the edges/peripheries support structure 508 is formed by etching the trench 540, mounting surfaces 510 (e.g., surfaces of the periphery) are part of the back surface 504 of the slider 502. That is, the mounting surfaces 510 are integral with the back surface 504 and all lie in a common plane. By lying in a common plane, the edges/peripheries 508a, 508b, 508c, 508d/mounting surfaces 510 provide a stable mounting surface for the COSA. Thus, the edges/peripheries 508a, 508b, 508c, 508d provide four contact points for the COSA at the same elevation as the back surface 504 of the slider 502.

The slider assembly 500 may further include an under bond material 520 located on the back surface of the slider 502 within the trench 540. As shown in FIGS. 9A-9C, the under bond material 520 may be directly in contact with the back surface of the slider 202 within the trench 540 (e.g., such that there is no intervening layer between the back surface and the under bond material 520). The under bond material 520 may have a substantially rectangular shape. The sidewalls defined by the trench 540 may surround the under bond material 520. Thus, as shown in FIG. 9B, edges/peripheries 508a, 508b, 508c, 508d of the trench 540 may be located around the perimeter of the under bond material 520.

The slider assembly 500 may further a bond material 530 located on the back surface of the slider 502 within the trench 540. Thus, the back surface of the slider 502 within the trench 540 may support the bond material 530. The bond material 530 may comprise a solder material. The bond material 530 may be in direct contact with the under bond material 520 (e.g., such that there is no intervening layer between the under bond material 520 and the bond material 530). As shown in FIG. 9B, the bond material 530 may have a substantially rectangular shape. The bond material 530 may have the same shape as the under bond material 520. As shown in FIGS. 9A and 9C, the bond materials 530 may be several times thicker than the under bond material 530, for example two to five times thicker. As shown in FIG. 9B the bond material 530 may have a smaller surface area than the under bond material 530. For example the area of the bond material 530 may be about two-thirds to about three-quarters the area of the under bond material 520. Thus, about one-quarter to about one-third of the surface area of the under bond material 520 may be uncovered with respect to the bond material 530.

As noted above, FIGS. 9A-9C shows the slider assembly 500 prior to bonding a COSA to the slider assembly 500. During the bonding process, which is described in more detail below, the bond material 530 is heated and pressurized such that the bonding material 530 becomes thinner and covers more surface area of the under bonding material 520. Accordingly, as shown in FIGS. 9A and 9C, the bonding material 530 may have an initial thickness that extends beyond surfaces 510 of the edges/peripheries 508a, 508b, 508c, 508d of the supporting feature 508, while also being spaced away from the edges/peripheries 508a, 508b, 508c, 508d of the trench 540 to allow for the redistribution of the bonding material 530. In other words, the top surface of the bond material may have an initial elevation that is higher than an elevation of the top surface of the support structure (including the top surface of each of the edges/peripheries of the support structure).

Figure 10A:
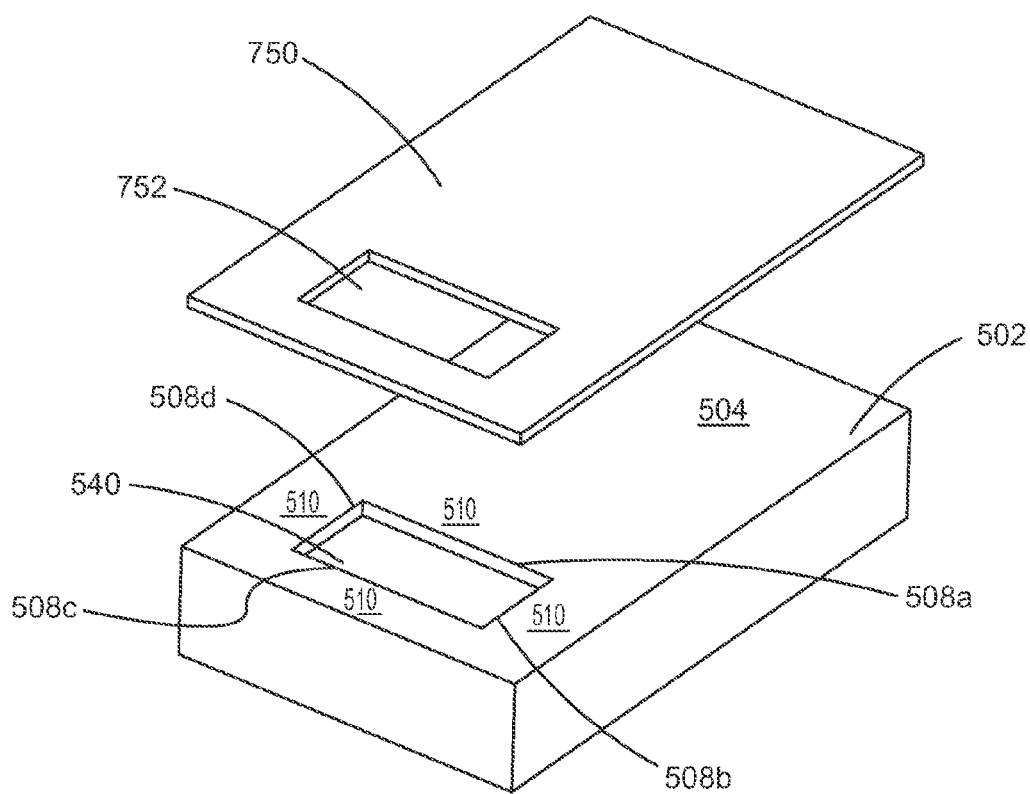
FIGS. 10A-10C are conceptual perspective views of an exemplary embodiment of a process for forming the slider assembly of FIGS. 9A-9C.
Figure 10B:
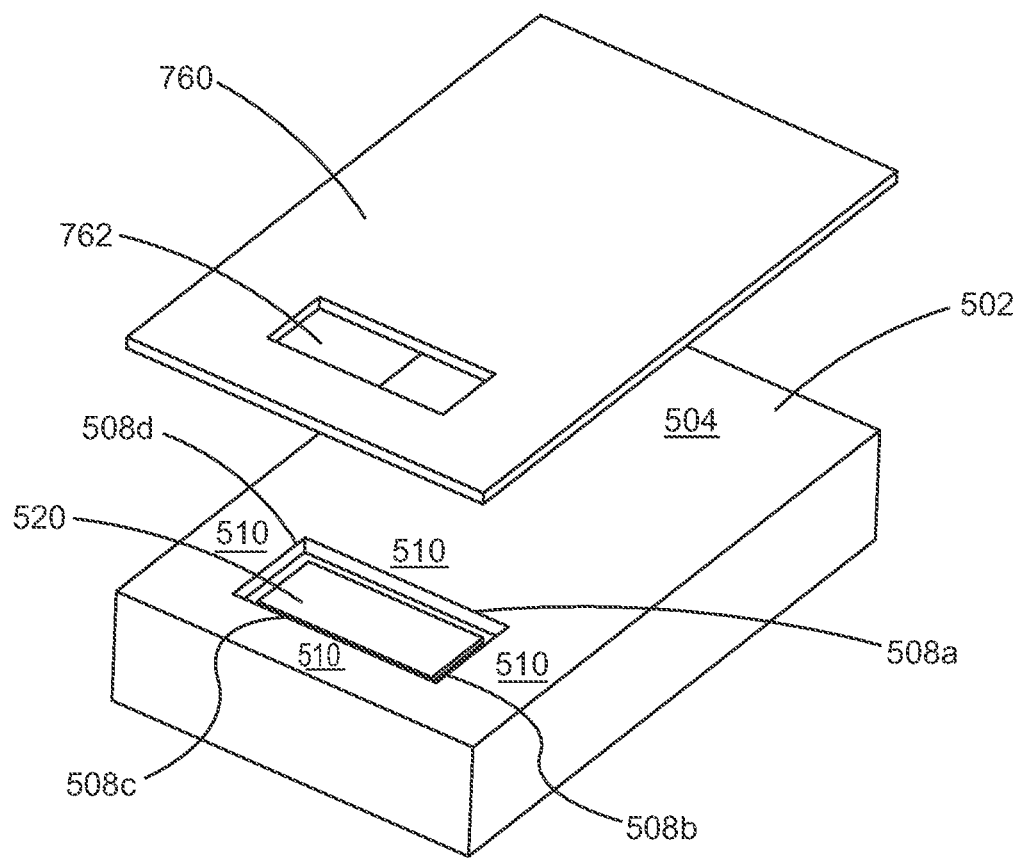
Figure 10C:
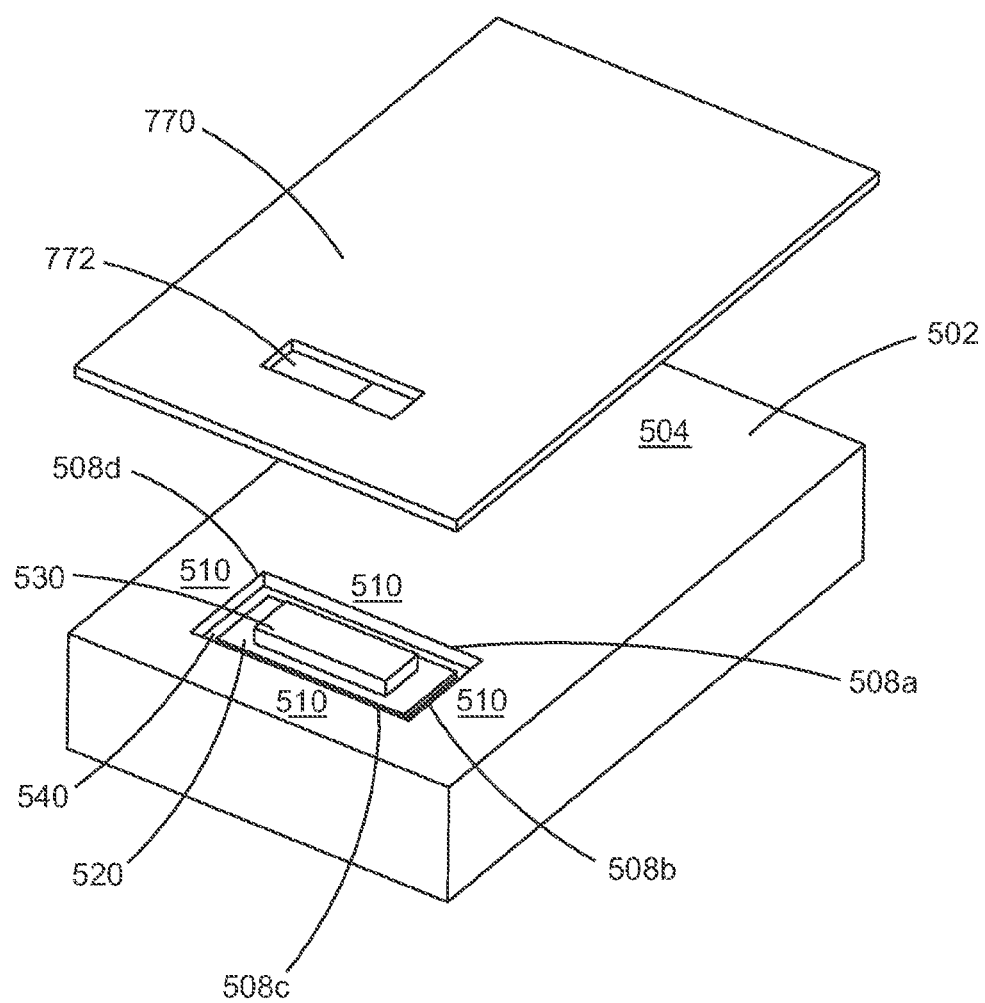

FIGS. 10A-10C are conceptual perspective views of an exemplary embodiment of a process for manufacturing the slider assembly 500 of FIGS. 9A-9C. FIG. 10A shows a first step where the trench 540 is formed into the back surface 504 of the slider 502. As shown in FIG. 10A, a first fabrication mask 750 having a first cutout 752 may be used to form the trench 540 into the back surface 504. The first fabrication mask 750 may be placed over the back surface 504 and then the etching may occur over the mask 750. As shown in FIG. 10A, first cutout 752 has the same shape, size, and relative position as the desired shape, size, and relative position of trench 540. Thus, when the etching is performed, the etching only occurs at the back surface 504 at the first cutout 752. Once the trench 540 has been formed, the first fabrication mask 750 may be removed. The forming of the trench 540 thus also forms the support structure 508 and edge/sidewalls 508a, 508b, 508c, 508d.

FIG. 10B shows a second step where the under bond material 520 is applied on the back surface of the slider 502 within the trench 540, and specifically. As shown in FIG. 10B, a second fabrication mask 760 having a second cutout 762 may be used to form the under bond material 520 on the back surface of the slider 502 within the trench 540. The second fabrication mask 760 may be placed over the back surface 504 and over a trench 540. Then, the under bond material may be applied over the second fabrication mask 760. As shown in FIG. 10B, second cutout 762 has the same shape, size, and relative position as the desired shape, size, and relative position of the under bond material 520. Thus, when the under bond material is applied onto the second fabrication mask 760, the under bond material is only able to contact that back surface of the slider 502 within the trench 540 at the first cutout 762. Once the under bond material 520 has been formed, the second fabrication mask 760 may be removed.

FIG. 10C shows a third step where bond material 530, is applied to the back surface 504 of the slider 502 within the trench 540, specifically, on the under bond material 520. As shown in FIG. 10C, a third fabrication mask 770 having a 772a may be used to form the bond material 530 onto the under bond material 520 within the trench 540. The third fabrication mask 770 may be placed over the back surface 504, over a portion of the under bond material 520 within the trench 540. Then, the bond material may be applied over the fabrication mask 760. As shown in FIG. 10C, the cutout 772 have the shape, size, and relative position as the corresponding desired shape, size, and relative position of bond material 530. Thus, when the bond material is applied onto the third fabrication mask 770, the bond material is only able to contact that the under bond material 520 at the cutout 772. Once the bond material, including the have been formed, the third fabrication mask 7 may be removed.

Figure 11A:
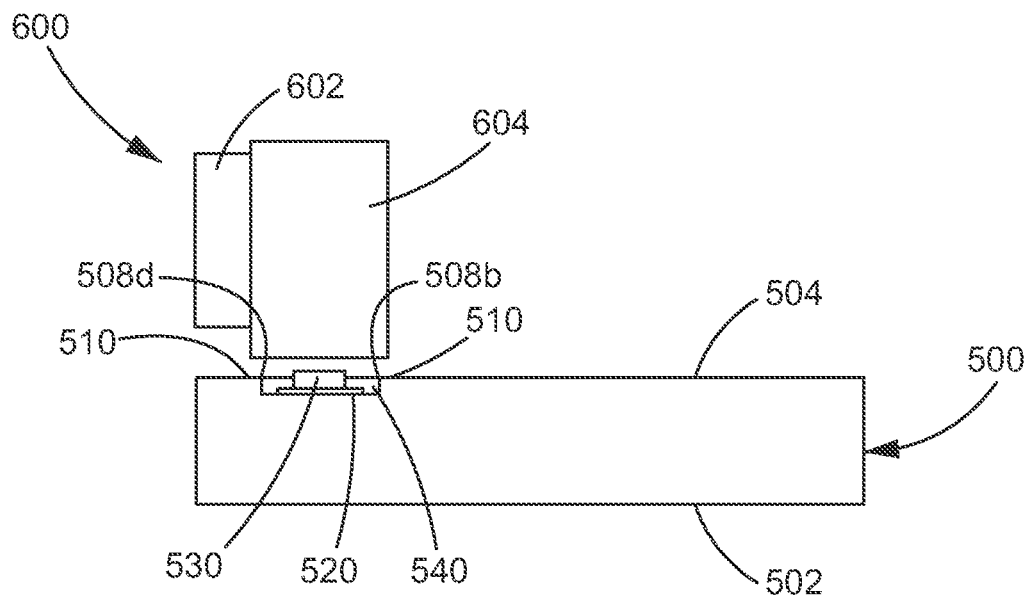
FIGS. 11A-11C are conceptual side views of an exemplary embodiment of a process for bonding a COSA onto the slider assembly of FIGS. 9A-9C.
Figure 11B:
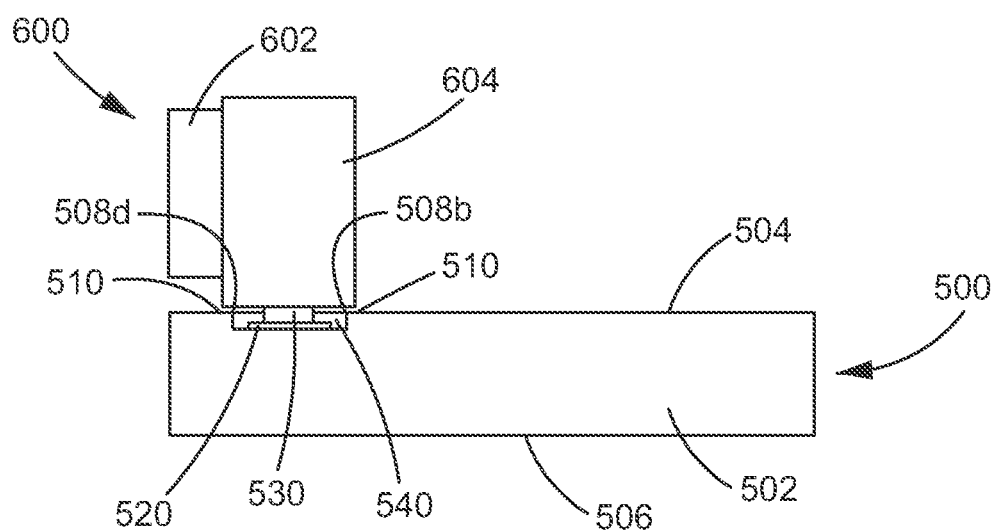
Figure 11C:
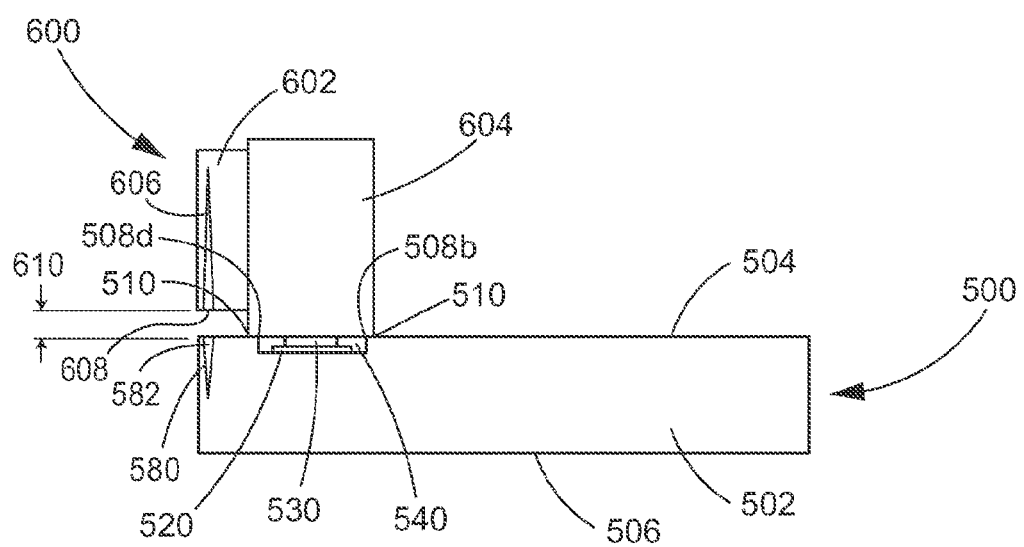

FIGS. 11A-11C are conceptual side views of an exemplary embodiment of a process for bonding a COSA 600 onto the slider assembly 500 of FIGS. 9A-9C. The COSA 600 may include a light source 602 such as a laser diode attached to a submount 604. More detail of the COSA are shown and discussed below with reference to FIG. 11C. FIG. 11A shows a first step of the process for bonding the COSA 600 to the slider assembly 500, where the COSA 600 is aligned with the slider 502. More specifically, a quantum well of the light source 602 is aligned with a wave guide of the slider 502 (see FIG. 11C).

Turning to FIG. 11B, the submount 604 is placed on top of the bond material 530. As shown in FIG. 11B, at this point in the process, the bond material 530 may extend higher than the surfaces 510 of the edges/peripheries 508a, 508b, 508c, 508d. In other words, the top surface of the bond material may have an initial elevation that is higher than an elevation of the top surface of the support structure (including the top surface of each of the edges/peripheries). Heat may then be applied along with a bonding force on the submount 604 in a direction toward the slider 502. The combination of heat and force causes the bond material to flow and redistribute its volume. The continued application of heat and force causes the bond material to become thinner while cover a larger portion of the surface of the under bond material 530. During this motion, as the bond material 520 becomes thinner, the COSA will move closer to the surfaces 510 of the edges/peripheries 508a, 508b, 508c, 508d of the support structure 508. The application of force is continually applied until the submount 604 contacts finally contacts the surfaces 510 of the edges/peripheries 508a, 508b, 508c, 508d.

The final position of the COSA 600 is shown in FIG. 11C. As shown in FIG. 11C, the submount is in contact with the surfaces 510 of the edges/peripheries 508a, 508b, 508c, 508d of the support structure 508. The surfaces 510 of the edges/peripheries 508a, 508b, 508c, 508d of the support structure 508 provide a flat plane of support for the COSA 600 and avoid unintentional tilting during the bonding. Furthermore, the surfaces 510 of the edges/peripheries 508a, 508b, 508c, 508d of the support structure 508 act as a stop to prevent the light source from crashing into the slider during the bonding procedure. After the COSA 600 is mounted on the support structure 508, the redistributed bond material 530 is cooled, thereby bonding the COSA 600 to the slider 502. Further, after the mounting, the height of the bonding material is level with the height of the separate components of the support structure. In other words, the top surface of the bond material may have a final elevation that is substantially equal to an elevation of the top surface of the support structure (including the top surface of each of the separate components of the support structure).

FIG. 11C also shows details of the final assembly with the COSA 600 mounted on the support structure 508. As shown in FIG. 11C, the light source 602 includes a quantum well 606 and an emission exit 608. By mounting the submount 604 onto the support feature 508, the quantum well 606 is aligned with the wave guide 280 of the slider 502 such the emission exit 608 is aligned with the entrance 582 of the wave guide. Further, the COSA is properly positioned such that the bottom surface of the COSA 600 is parallel with the back surface 504 of the slider 502. Additionally, there is a proper gap 610 between the emission exit 608 and the wave guide entrance 582.

Figure 12A:
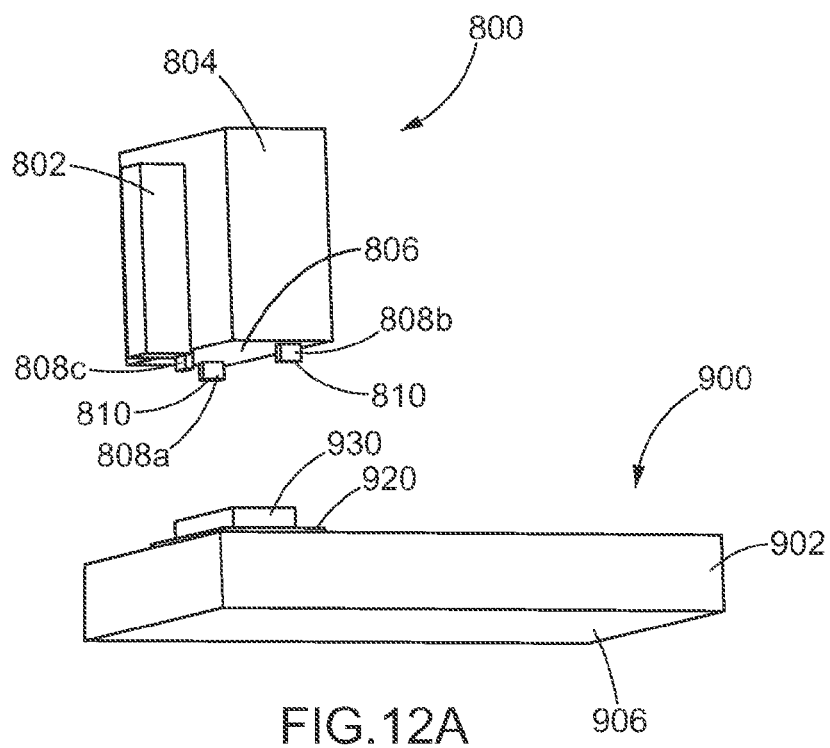
FIGS. 12A and 12B are exploded conceptual side and top perspective views, respectively, of another exemplary embodiment of a slider assembly prior to bonding a COSA to the slider assembly.
Figure 12B:
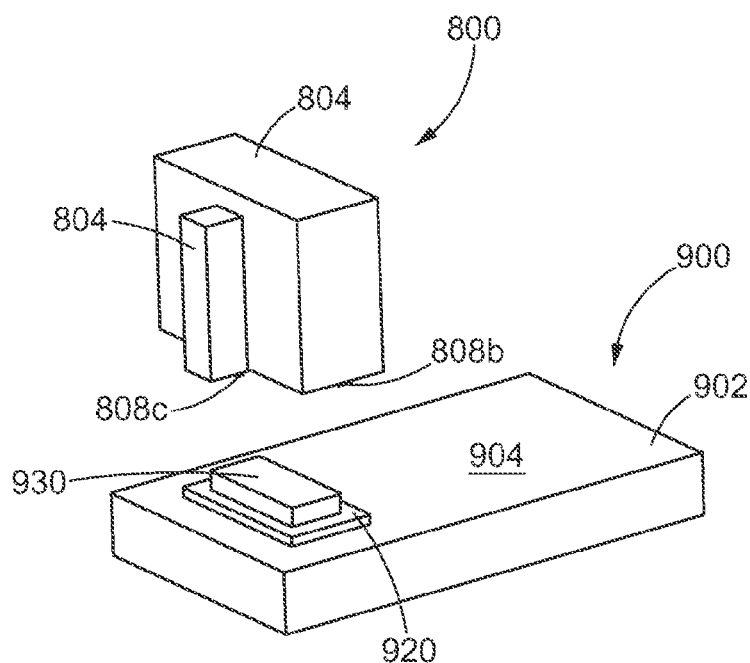
Figure 12C:
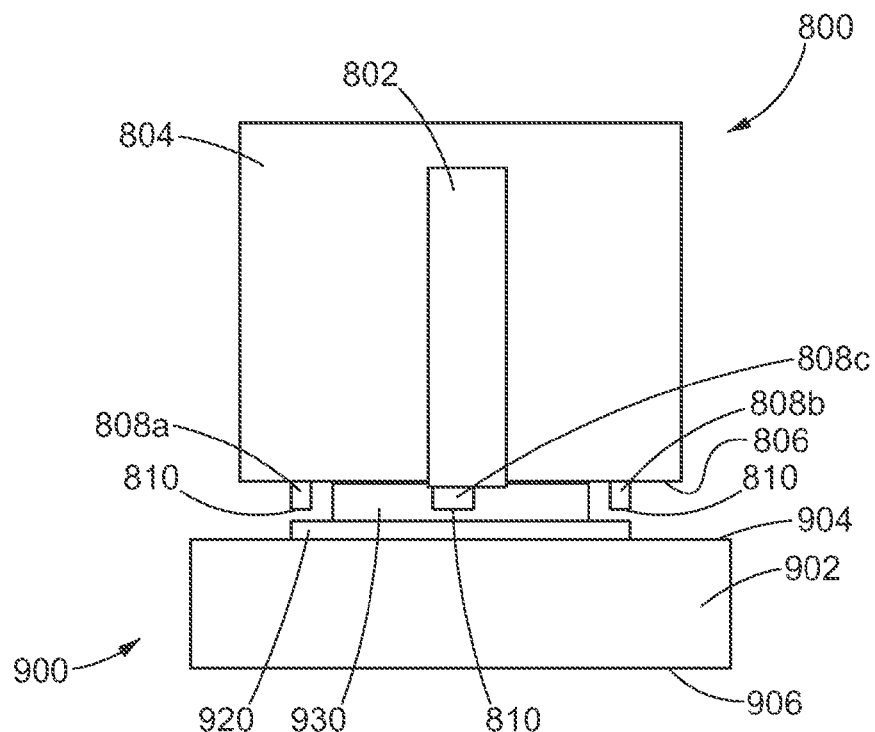
FIG. 12C is a conceptual front view of the slider assembly of FIG. 12A just prior to bonding the COSA to the slider assembly.
Figure 12D:
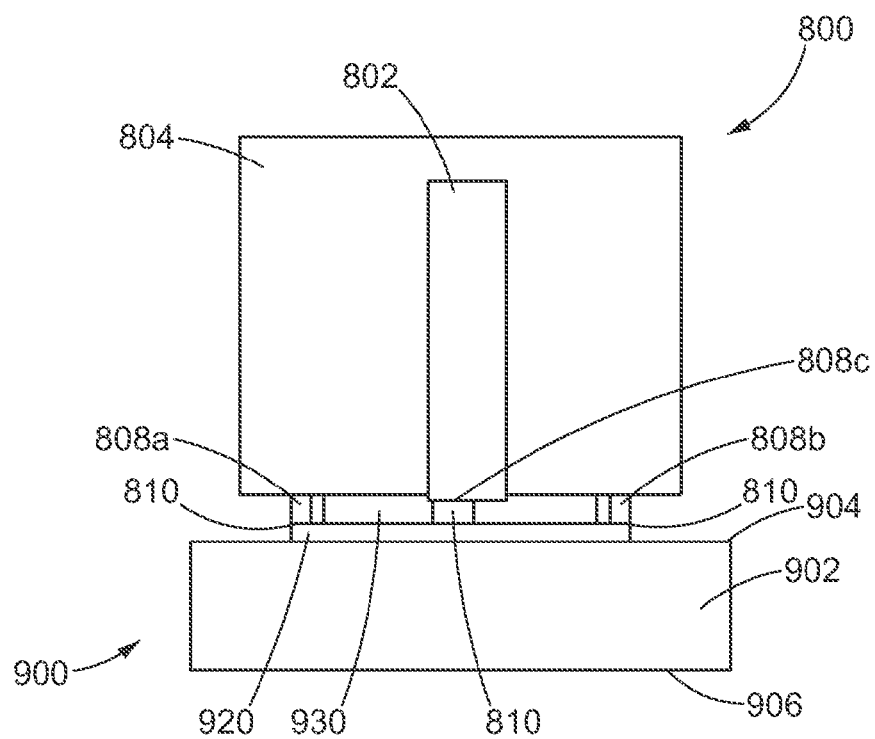
FIG. 12D is a conceptual front view of the slider assembly of FIG. 12A after the COSA is bonded to the slider assembly.

FIG. 12A is a conceptual side perspective view of another exemplary embodiment of a slider assembly 900 prior to mounting a COSA 800 on the slider assembly 900. FIG. 12B is a conceptual top perspective view of the exemplary embodiment of the slider assembly 900 prior to mounting the COSA 800. FIG. 12C is a front view of the exemplary embodiment of the slider assembly 900 just before the COSA 800 is mounted to the slider assembly 900. FIG. 12D is a front view of the slider assembly 900 after the COSA 800 has been fully mounted to the slider assembly 900. The slider assembly 900 may include a slider 902 having a back surface 904. The back surface 904 may oppose an ABS surface 906. The COSA 800 may include a light source 802 and a submount 804 having an underside surface 806. The exemplary embodiment shown in FIGS. 12-12D is similar to the exemplary embodiment shown in FIGS. 3A-3C, except that instead of the slider 902 including a support structure, the COSA 800 includes the support structure 808. The support structure 808 may be mounted to the underside surface 806 of the submount 804. As best seen in FIGS. 12A 13C, and 12D, the support structure 808 may project from underside surface 806 of the submount 804 in a direction toward the back surface 904 of the slider 902. The support structure may include a plurality of separate components. As shown in FIGS. 12A, 12C, and 12D, the support structure 808 may include three separate components 808a, 808b, 808c. Each of the separate components 808a, 808b, 808c may include a mounting surface 810 for contacting the slider assembly 900. The mounting surfaces 810 may be substantially flat. The height of each of the separate components 808a, 808b, 808c of the support structure 808 may be identical such that the surfaces 810 all lie in a common plane. By lying in a common plane, the separate components 808a, 808b, 808c provide a stable mounting surface mounting the COSA 800 to the slider assembly 900. Thus, the separate comments 808a, 808b, 808c provide three contact points for mounting the COSA 800 to slider assembly 900.

The slider assembly 900 may further include an under bond material 920 located on the back surface 904 of the slider 902. As shown in FIGS. 12A-12D, the under bond material 920 may be directly in contact with the back surface 904 of the slider 902 (e.g., such that there is no intervening layer between the back surface 904 and the under bond material 920). The under bond material 920 may have a substantially rectangular shape. Once the COSA 800 is fully mounted onto the slider assembly 900 (see FIG. 12D), the separate components 808a, 808b, 808c of the support structure 808 may be located on the under bond material 920. Once the COSA 800 is fully mounted onto the slider assembly 900 (see FIG. 12D), the separate components 808a, 808b, 808c of the support structure 808 may be in direct contact with the under bond material 920 (e.g., such that there is no intervening layer between the under bond material 920 and the separate components 808a, 808b, 808c). As shown in FIG. 12C, each of the separate components 808a, 808b, 808c may be located on the surface 806 such that once the COAS 800 is fully mounted onto the slider assembly 900, the components 808a, 808b, 808c are located at the perimeter of the under bond material 920, for example on different edges of the rectangular shaped under bond material 920. Each of the separate components 808a, 808b, 808c, 808d may have a substantially rectangular shape so as to cover either a portion of a horizontal or a vertical edge (in the orientation of FIG. 12A) of the rectangular shaped under bond material 920 when the COSA 800 is fully mounted to the slider assembly 900. As shown in FIG. 12D, two components 808a, 808b of the separate components may be located on opposing edges of the shorter of the rectangular shaped under bond material 920 when the COSA 800 is fully mounted to the slider assembly 900. A third component 808c of the separate components may be located on one of the longer edges of the rectangular shaped under bond material 920 when the COSA 800 is fully mounted to the slider assembly 900. Furthermore, each of the separate components 808a, 808b, 808c may be located substantially midway along the length of the respective edge of the rectangular under bond material 920 when the COSA 800 is fully mounted to the slider assembly 900. The component 808c may have a longer length than the components 808a, 808b because it is located on the longer edge of the rectangular under bond material 920 when the COSA 800 is fully mounted to the slider assembly 900. While each of the separate components of the support structure are shown as only being in contact with the under bond material when the COSA 800 is fully mounted to the slider assembly 900, in another exemplary embodiment, the support structure (including one or more or all of the separate components) may be positioned adjacent the under bond material such that the support structure is only in contact with the back surface of the slider when the COSA 800 is fully mounted to the slider assembly 900. In yet another exemplary embodiment, the support structure (including one or more or all of the separate components) may be positioned such that the support structure is in contact with both the under bond material and the back surface of the slider when the COSA 800 is fully mounted to the slider assembly 900.

The slider assembly 900 may further a bond material 930 located on the back surface 904 of the slider 902. Thus, the back surface 904 of the slider 902 may support the bond material 930. The bond material 930 may comprise a solder material. The bond material 930 may be in direct contact with the under bond material 920 (e.g., such that there is no intervening layer between the under bond material 920 and the bond material 930. As shown in FIG. 12B, the bond material 930 may have a substantially rectangular shape. The bond material 930 may have the same shape as the under bond material 920. As shown in FIGS. 12A-12D, the bond materials 930 may be several times thicker than the under bond material 930, for example two to five times thicker. As shown in FIG. 12B the bond material 930 may have a smaller surface area than the under bond material 930. For example the area of the bond material 930 may be about two-thirds to about three-quarters the area of the under bond material 920. Thus, about one-quarter to about one-third of the surface area of the under bond material 920 may be uncovered with respect to the bond material 930.

As noted above, FIGS. 12A-12C shows the slider assembly 900 prior to bonding a COSA 800 to the slider assembly 900. During the bonding process, which is described in more detail below, the bond material 930 is heated and pressurized such that the bonding material 930 becomes thinner and covers more surface area of the under bonding material 920. Accordingly, as shown in FIG. 12C, the bonding material 930 may have an initial thickness that extends beyond the thickness of each of the separate components 808a, 808b, 808c, of the supporting member 808, while also being spaced away from the separate components 808a, 808b, 808c, to allow for the redistribution of the bonding material 930.

Mounting of the COSA 800 to the slider assembly 900 will now be described. First, the COSA 800 is aligned with the slider 902. More specifically, a quantum well of the light source 802 is aligned with a wave guide of the slider 902, which is the same as discussed above with respect to FIGS. 6A-8C. The positioning of the COSA 800 just before mounting is shown in FIG. 12C.

The submount 804 is then placed on top of the bond material 930. As shown in FIG. 12C, at this point in the process, the bond material 930 may be thicker than the support structure 808 including the separate components 808a, 808b, 808c such that the mounting surfaces 810 do not contact to the slider assembly 900. Heat may then be applied along with a bonding force on the submount 804 in a direction toward the slider 902. The combination of heat and force causes the bond material to flow and redistribute its volume. The continued application of heat and force causes the bond material to become thinner while cover a larger portion of the surface of the under bond material 930. During this motion, as the bond material 920 becomes thinner, the COSA 800 will move closer to the separate components 808a, 808b, 808c, of the support structure 808. The application of force is continually applied until the separate components 308a, 308b, 308c of the support structure 308 finally contact the slider assembly 900 (e.g., the under bond material 920 or the back surface 904).

The final position of the COSA 800 is shown in FIG. 12D. As shown in FIG. 12D, the separate components 808a, 808b, 808c of the support structure 808 is in contact with the under bond material 920. The separate components 808a, 808b, 808c of the support structure 808 provide a flat plane of support for the COSA 800 and avoid unintentional tilting during the bonding. Furthermore, the separate components 808a, 808b, 808c of the support structure 808 act as a stop to prevent the light source from crashing into the slider during the bonding procedure. After the COSA 800 is mounted on the support structure 808, the redistributed bond material 930 is cooled, thereby bonding the COSA 800 to the slider 902. Further, after the mounting, the height of the bonding material is level with the height of the separate components of the support structure.

While not illustrated in the exemplary embodiment of FIGS. 12A-12D, by mounting the submount 804 onto the slider assembly 900 via the support structure 808, a quantum well of the light source 802 is aligned with a wave guide of the slider 902 such the emission exit of the light source is aligned with the entrance of the wave guide. The arrangement would be the same as shown in FIG. 7C. Further, the COSA is properly positioned such that the bottom surface of the COSA 800 is parallel with the back surface 904 of the slider 902. Additionally, there is a proper gap between the emission exit and the wave guide entrance (the same gap as shown in FIG. 7C)

Figure 13A:
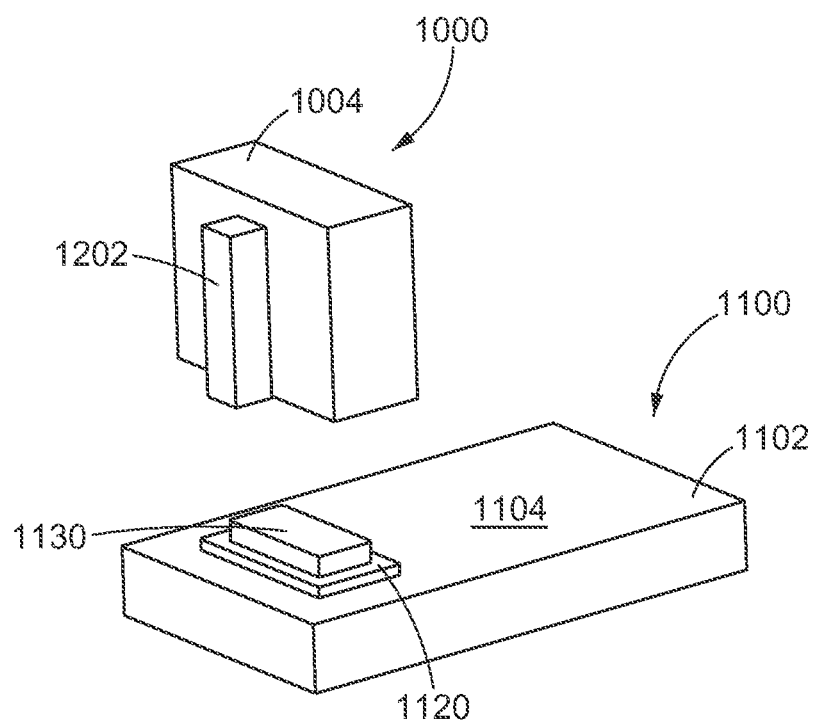
FIGS. 13A and 13B are exploded conceptual top and bottom perspective views, respectively, of another exemplary embodiment of a slider assembly.
Figure 13B:
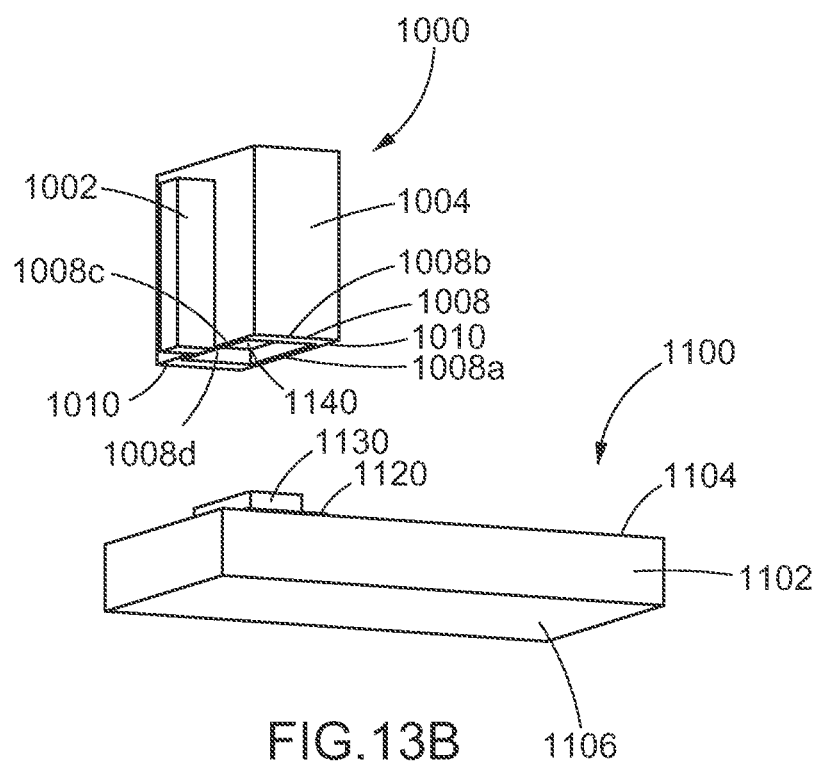
Figure 13C:
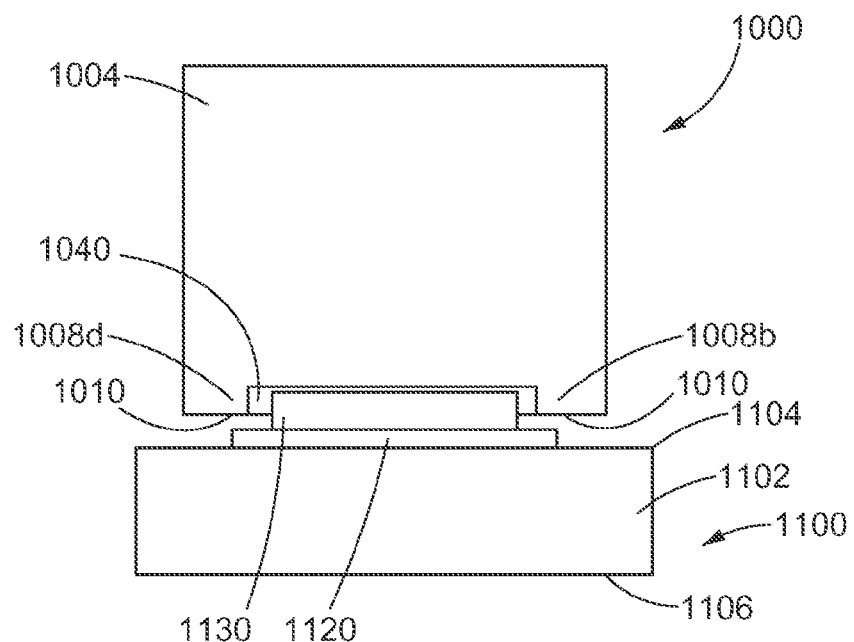
FIG. 13C is a conceptual cross section view of the slider assembly of FIGS. 13A and 13B just prior to bonding the COSA to the slider assembly.
Figure 13D:
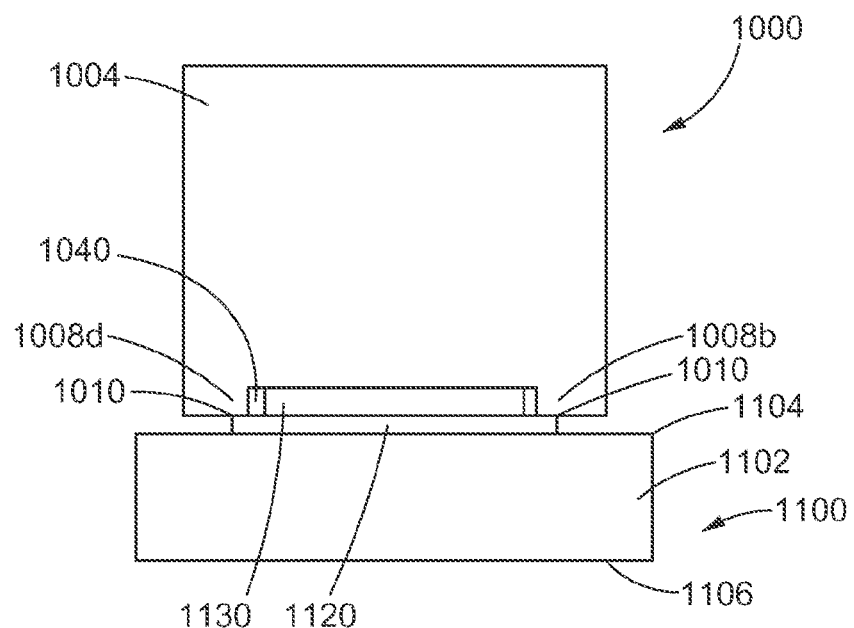
FIG. 13D is a conceptual cross section view of the slider assembly of FIGS. 13A and 13B after the COSA is bonded to the slider assembly.

FIG. 13A is a conceptual perspective top view of an exemplary embodiment of a slider assembly 1100 prior to mounting a COSA 1000 on a slider assembly 1100. FIG. 13B is a conceptual bottom perspective view of the exemplary embodiment of the slider assembly 1100 prior to mounting the COSA 1000. FIG. 12C is a cross section view of slider assembly 1100 just before the COSA 1000 has been fully mounted to the slider assembly 1100. FIG. 12D is a cross section view of the slider assembly 1100 after the COSA 1000 has been fully mounted to the slider assembly 1100. The slider assembly 1100 may include a slider 1102 having a back surface 1104. The back surface 1104 may oppose an ABS surface 1106. The COSA 800 may include a light source 1002 and a submount 1004. The exemplary embodiment shown in FIGS. 13A-13D is similar to the exemplary embodiment shown in FIGS. 9A-9C, except that instead of the slider 1102 including a support structure, the COSA 1000 includes the support structure 1008. The support structure 1008 may be integrally formed with submount 1004 of the COSA. As best seen in FIGS. 13B, 13C, and 13D, the support structure 1008 may be formed at an underside of the submount 1003 by a trench 1040. The trench 1040 may be formed by etching out the material of the submount 1004 at an underside surface. The sidewalls (i.e., the periphery) of the trenches form the support structure 1008. The support structure 1008 may include a plurality of edges/peripheries (e.g., defined by the sidewalls of the trench), forming, for example, a substantially rectangular shape. As shown in FIG. 13B, the support structure 1008 may include four edges/peripheries 1008a, 1008b, 1008c, 1008d (e.g., four sidewalls defined by the trench 1040). Each of the separate edges/peripheries 1008a, 1008b, 1008c, 1008d may include a mounting surface 1010 for contacting the slider assembly 1100. The mounting surfaces 1010 may be substantially flat. As discussed above, because the edges/peripheries support structure 1008 is formed by etching the trench 1040, mounting surfaces 1010 are part of the submount 1004 of the COSA 1000. That is, the mounting surfaces 1010 are integral with the submount 1004 of the COSA 1000 and lie in a common plane. By lying in a common plane, the edges/peripheries 1008a, 1008b, 1008c, 1008d/ mounting surfaces 1010 provide a stable mounting surface for the COSA 1000 onto the slider assembly 1100. Thus, the edges/peripheries 1008a, 1008b, 1008c, 1008d provide four contact points for the COSA 1000 to contact the slider assembly 1100, such as the back surface 1104 of the slider 1102 or the underbond material 1120 discussed below.

The slider assembly 1100 may further include an under bond material 1120 located on the back surface of the slider 1102. As shown in FIGS. 13A-13D, the under bond material 1120 may be directly in contact with the back surface of the slider 1102 (e.g., such that there is no intervening layer between the back surface and the under bond material 1120). The under bond material 1120 may have a substantially rectangular shape. The sidewalls defined by the trench 1040 may contact the under bond material 1120 when the COSA 1000 has been fully mounted onto the slider assembly 1100. Thus, as shown in FIG. 13D, edges/peripheries 1008a, 1008b, 1008c, 1008d of the trench 1040 may be located around a perimeter of the under bond material 1120 when the COSA 1000 has been fully mounted onto the slider assembly 1100.

The slider assembly 1100 may further a bond material 1130 located on the back surface of the slider 1102, which may extend within the trench 1040 when the COSA 1000 has been fully mounted onto the slider assembly 1100. Thus, the back surface of the slider 1102 may support the bond material 1130. The bond material 1130 may comprise a solder material. The bond material 1130 may be in direct contact with the under bond material 1120 (e.g., such that there is no intervening layer between the under bond material 1120 and the bond material 1130). As shown in FIG. 13A, the bond material 1130 may have a substantially rectangular shape. The bond material 1130 may have the same shape as the under bond material 1120. As shown in FIGS. 13A-13C, the bond materials 1130 may be several times thicker than the under bond material 1130, for example two to five times thicker. As shown in FIG. 13A the bond material 1130 may have a smaller surface area than the under bond material 1130. For example the area of the bond material 1130 may be about two-thirds to about three-quarters the area of the under bond material 1120. Thus, about one-quarter to about one-third of the surface area of the under bond material 1120 may be uncovered with respect to the bond material 1130.

FIGS. 13A-13B shows the slider assembly 1100 prior to bonding a COSA 1000 to the slider assembly 1100, FIG. 13C shows the slider assembly 1100 just prior to the COSA 1000 being fully bonded to the slider assembly 1100, and FIG. 13D shows the slider assembly 1100 after the COSA 1000 has been fully bonded to the slider assembly 1100. During the bonding process, which is described in more detail below, the bond material 1130 is heated and pressurized such that the bonding material 1130 becomes thinner and covers more surface area of the under bonding material 1120. Accordingly, as shown in 13C, the bonding material 1130 may have an initial thickness that extends beyond surfaces 1010 of the edges 1008a, 1008b, 1008c, 1008d of the supporting feature 1008, while also being spaced away from the edges/peripheries 1008a, 1008b, 1008c, 1008d of the trench 1040 to allow for the redistribution of the bonding material 1130. In other words, the bond material may have an initial height that is greater than the height of the trench (i.e., height of the walls defining the trench).

Mounting of the COSA 1000 to the slider assembly 1100 will now be described. First, the COSA 1000 is aligned with the slider 1102. More specifically, a quantum well of the light source 1002 is aligned with a wave guide of the slider 1102, which is the same as discussed above with respect to FIGS. 11A-11C. The positioning of the COSA 1000 just before mounting is shown in FIG. 13C.

Turning to FIG. 13C, the submount 1004 is placed on top of the bond material 1130 such that the surface of the bond material 1130 contacts the surface 1042 of the trench 1040. As shown in FIG. 13C, at this point in the process, the bond material 1130 may have a greater thickness/height than height of the trench 1040. That is, the thickness/height of the bond material 1130 may be greater than the height of the edges/peripheries 1008a, 1008b, 1008c, 1008d that define the trench 1040. Heat may then be applied along with a bonding force on the submount 1004 in a direction toward the slider 1102. The combination of heat and force causes the bond material to flow and redistribute its volume. The continued application of heat and force causes the bond material to become thinner while cover a larger portion of the surface of the under bond material 1130. During this motion, as the bond material 1130 becomes thinner, the COSA will move closer to the surfaces 1010 of the edges/peripheries 1008a, 1008b, 1008c, 1008d of the support structure 1008. The application of force is continually applied until the surfaces 1010 of the edges/peripheries 1008a, 1008b, 1008c, 1008d contact the back surface 1104 and/or the under bond material 1120.

The final mounted position of the COSA 1000 is shown in FIG. 13D. As shown in FIG. 13D, the surfaces 1010 of the edges/peripheries 1008a, 1008b, 1008c, 1008d of the support structure 1008 are in contact with the under bond material 1120. The surfaces 1010 of the edges/peripheries 1008a, 1008b, 1008c, 1008d of the support structure 1008 provide a flat plane of support for the COSA 1000 onto the slider assembly 1100 and avoid unintentional tilting during the bonding. Furthermore, the surfaces 1010 of the edges/peripheries 1008a, 1008b, 1008c, 1008d of the support structure 1008 act as a stop to prevent the light source 1002 from crashing into the slider 1102 during the bonding procedure. After the COSA 1000 is mounted onto the slider assembly 1110 via the support structure 1008, the redistributed bond material 1130 is cooled, thereby bonding the COSA 1000 to the slider assembly 1100. Further, after the mounting, the height of the bonding material is level with the height of the separate components of the support structure. In other words, the height of the bond material may have a final height that is substantially equal to the height of the sidewalls that define the trench.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:

1. A substrate assembly, comprising:
   a substrate having a first surface and an opposing second surface;
   a chip coupled with a carrier, the carrier comprising a third surface facing the second surface of the substrate; and
   a support structure mounted to the second surface of the substrate and in contact with the third surface of the carrier.

2. The substrate assembly of claim 1, wherein the substrate comprises a slider, wherein the first surface comprises an air bearing surface (ABS), and wherein the carrier comprises a submount.

3. The substrate assembly of claim 1, wherein the support structure comprises at least three contact points in contact with the carrier.

4. The substrate assembly of claim 3, wherein the support structure further comprises at least three separate components each comprising one of the contact points.

5. The substrate assembly of claim 4, further comprising a bond material on the second surface of the substrate, wherein each of the at least three separate components contacts a portion of the bond material.

6. The substrate assembly of claim 4, wherein each of the at least three components contacts a portion of the second surface of the substrate.

7. A hard disk drive comprising:
   a rotatable magnetic recording disk; and
   the substrate assembly of claim 1 configured for heat assisted magnetic recording (HAMR) to the magnetic recording disk,
   wherein the carrier comprises a submount,
   wherein the substrate comprises a slider, and
   wherein the first surface comprises an air bearing surface (ABS) of the slider.

8. A method of bonding a chip and carrier assembly to a substrate, the substrate having a first surface and an opposing second surface and a bond material on the second surface, and one of the chip and carrier assembly or the substrate having a support structure, the method comprising:
   contacting the chip and carrier assembly with the bond material; and
   applying heat and force on the chip and carrier assembly until the support structure is mounted on the second surface of the substrate and in contact with the carrier.

9. The method of claim 8, wherein the substrate comprises a slider, wherein the first surface comprises an air bearing surface (ABS), and wherein the carrier comprises a submount.

10. The method of claim 8, wherein the chip and carrier assembly comprises the support structure.

11. The method of claim 8, wherein the substrate comprises the support structure.

12. The method of claim 8, wherein the support structure comprises at least three contact points and wherein the applying heat and force on the chip and carrier assembly further comprises one of contacting the chip and carrier assembly with the at least three contact points or contacting the substrate with the at least three contact points.

13. The method of claim 12, wherein the support structure further comprises at least three separate components each comprising one of the contact points.

14. The method of claim 12, wherein the applying heat and force on the chip and carrier assembly further comprises contacting each of the at least three separate components with a portion of the bond material.

15. The method of claim 8, wherein the carrier comprises a surface facing the second surface of the substrate, and wherein before or after the applying the heat and force on the chip and carrier assembly the support structure is in contact with surface of the carrier.

16. A substrate assembly, comprising:
   a chip coupled with a carrier;
   a substrate having a first surface and an opposing second surface; and
   one of the carrier or the substrate comprising a trench having a periphery defined by a plurality of sidewalls, each of the sidewalls having a surface facing the second surface or coplanar with the second surface,
   wherein the second surface of the substrate supports the carrier along the surface of each sidewall.

17. The substrate assembly of claim 16, wherein the substrate comprises a slider, wherein the first surface comprises an air bearing surface (ABS), and wherein the carrier comprises a submount.

18. The substrate assembly of claim 16, wherein periphery of the trench comprises at least three contact points in contact with the carrier.

19. The substrate assembly of claim 16, wherein the carrier comprises the trench.

20. The substrate assembly of claim 16, wherein the substrate comprises the trench.

21. The substrate assembly of claim 16, further comprising a bond material, wherein the bond material is at least partially disposed within the trench.

22. A hard disk drive comprising:
   a rotatable magnetic recording disk; and
   the substrate assembly of claim 16 configured for heat assisted magnetic recording (HAMR) to the magnetic recording disk,
   wherein the carrier comprises a submount,
   wherein the substrate comprises a slider, and
   wherein the first surface comprises an air bearing surface (ABS) of the slider.

23. A method of bonding a chip and carrier assembly to a substrate, the substrate having a first surface and an opposing second surface, one of the chip and carrier assembly or the substrate comprising a trench having a periphery defined by a plurality of sidewalls, each of the sidewalls having a surface facing the second surface or coplanar with the second surface, and a bond material at least partially disposed within the trench, the method comprising:

contacting the chip and carrier assembly with the bond material; and applying heat and force on the chip and carrier assembly until the second surface of the substrate supports the chip and carrier assembly along the surface of each sidewall.

24. The method of claim 23, wherein the substrate comprises a slider, wherein the first surface comprises an air bearing surface (ABS), and wherein the carrier comprises a submount.

25. The method of claim 23, wherein the chip and carrier assembly comprises the trench.

26. The method of claim 23, wherein the substrate comprises the trench.

27. The method of claim 23, wherein periphery of the trench comprises at least three contact points and wherein the applying heat and force on the chip and carrier assembly further comprises one of contacting the chip and carrier assembly with the at least three contact points or contacting the substrate with the at least three contact points.

\* \* \* \* \*